(12) United States Patent
Tokiwa

(10) Patent No.: US 6,950,345 B1
(45) Date of Patent: Sep. 27, 2005

(54) NONVOLATILE SEMICONDUCTOR MEMORY DEVICE

(75) Inventor: Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/874,361

(22) Filed: Jun. 24, 2004

(30) Foreign Application Priority Data

Mar. 12, 2004 (JP) .............................. 2004-071475

(51) Int. Cl.$^7$ ........................................... G11C 16/06
(52) U.S. Cl. ..................... 365/185.22; 365/185.04; 365/201; 711/164; 713/200
(58) Field of Search ................ 365/185.22, 185.04, 365/201; 711/164; 713/200

(56) References Cited

U.S. PATENT DOCUMENTS 6,731,536 B1 * 5/2004 McClain et al. ....... 365/185.04
6,751,716 B2 * 6/2004 Sumitani et al. ............ 711/164

FOREIGN PATENT DOCUMENTS

JP  2003-12688  5/2003

* cited by examiner

Primary Examiner—Anh Phung
Assistant Examiner—N. Nguyen
(74) Attorney, Agent, or Firm—Oblon, Spivak, McClelland, Maier & Neustadt, P.C.

(57) ABSTRACT

A nonvolatile semiconductor memory device with a function of executing a verify operation for write data that is input from outside includes a memory cell array including memory cells arranged in a matrix, and a password storage area for storing password data, an input buffer that receives data input from outside, a first retaining circuit that retains input password data or write data, which is input to the input buffer, a verify sense amplifier that detects, at a time of the verify operation, the password data that is read out of the password storage area or data that is read out of the memory cell array, and a coincidence determination circuit that determines whether the input password data coincides with the read-out password data, or determines whether the write data coincides with the read-out data.

18 Claims, 18 Drawing Sheets

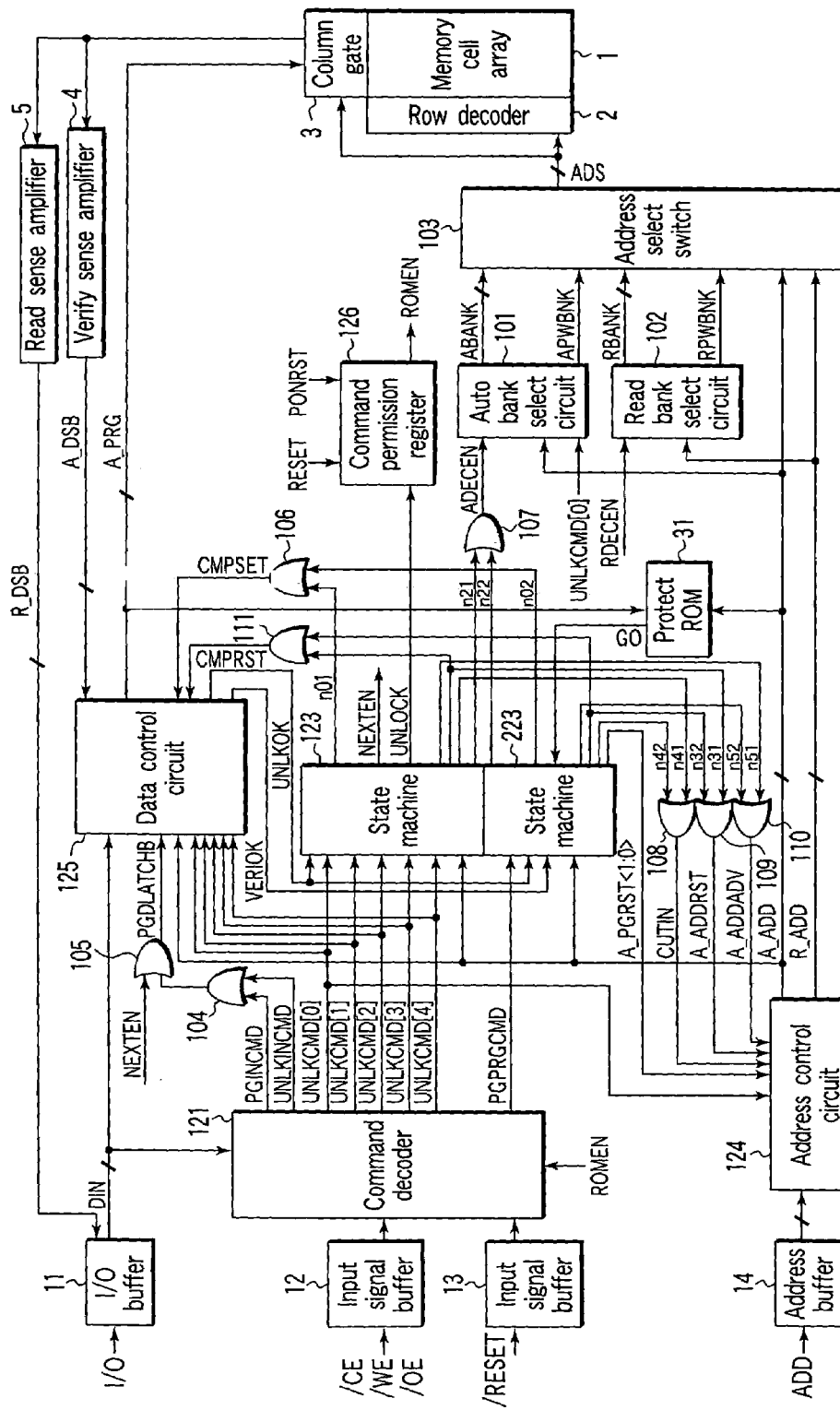
F I G. 1

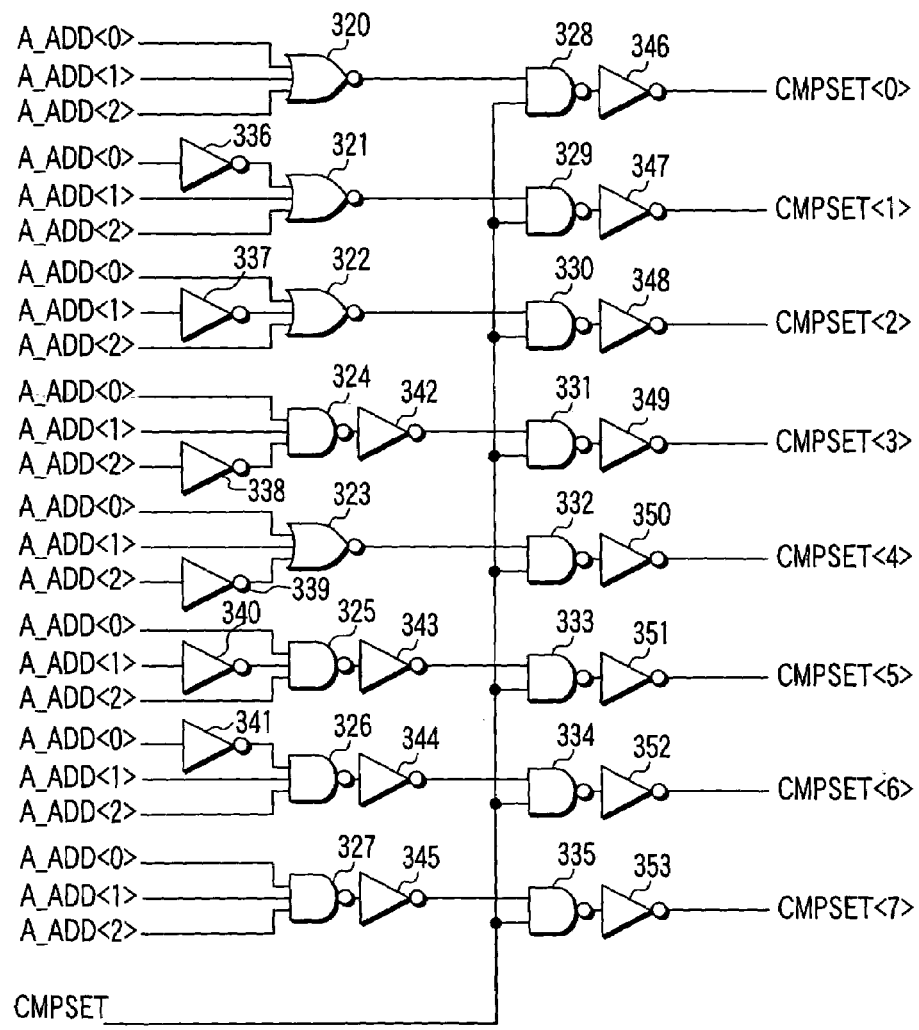
F I G. 8

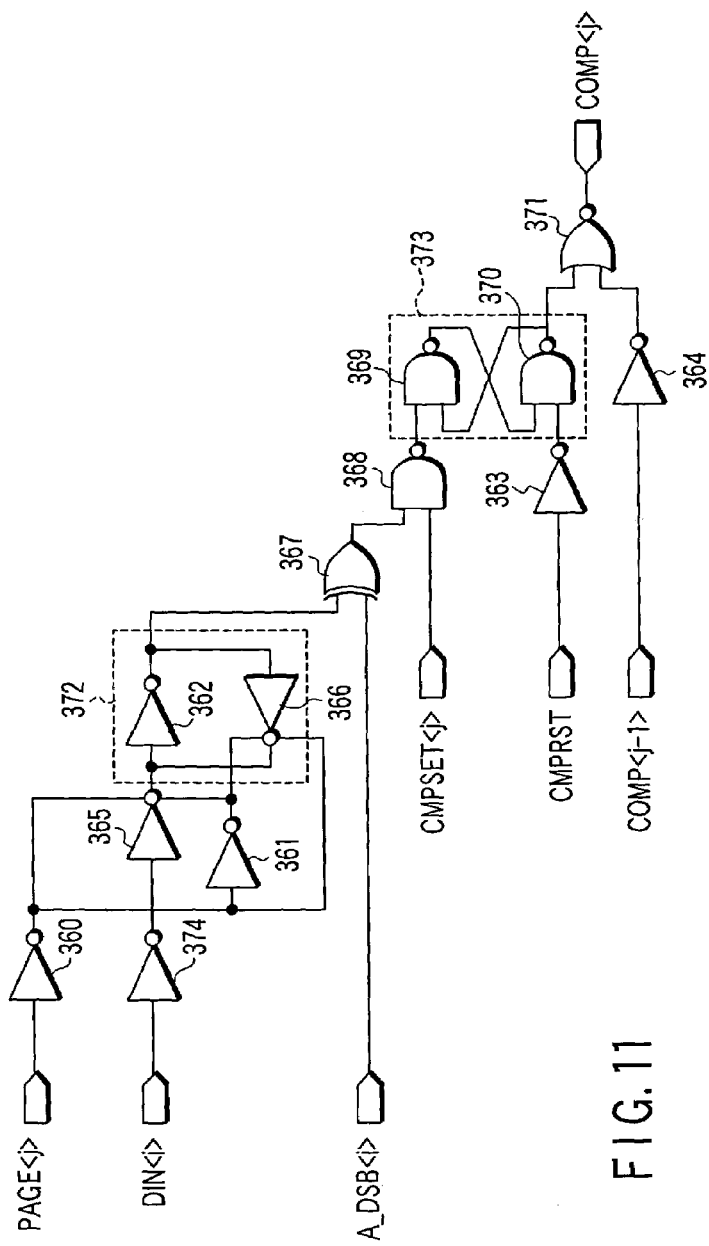
F I G. 11
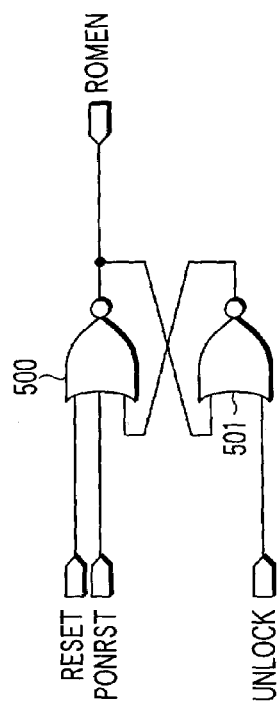
F I G. 12

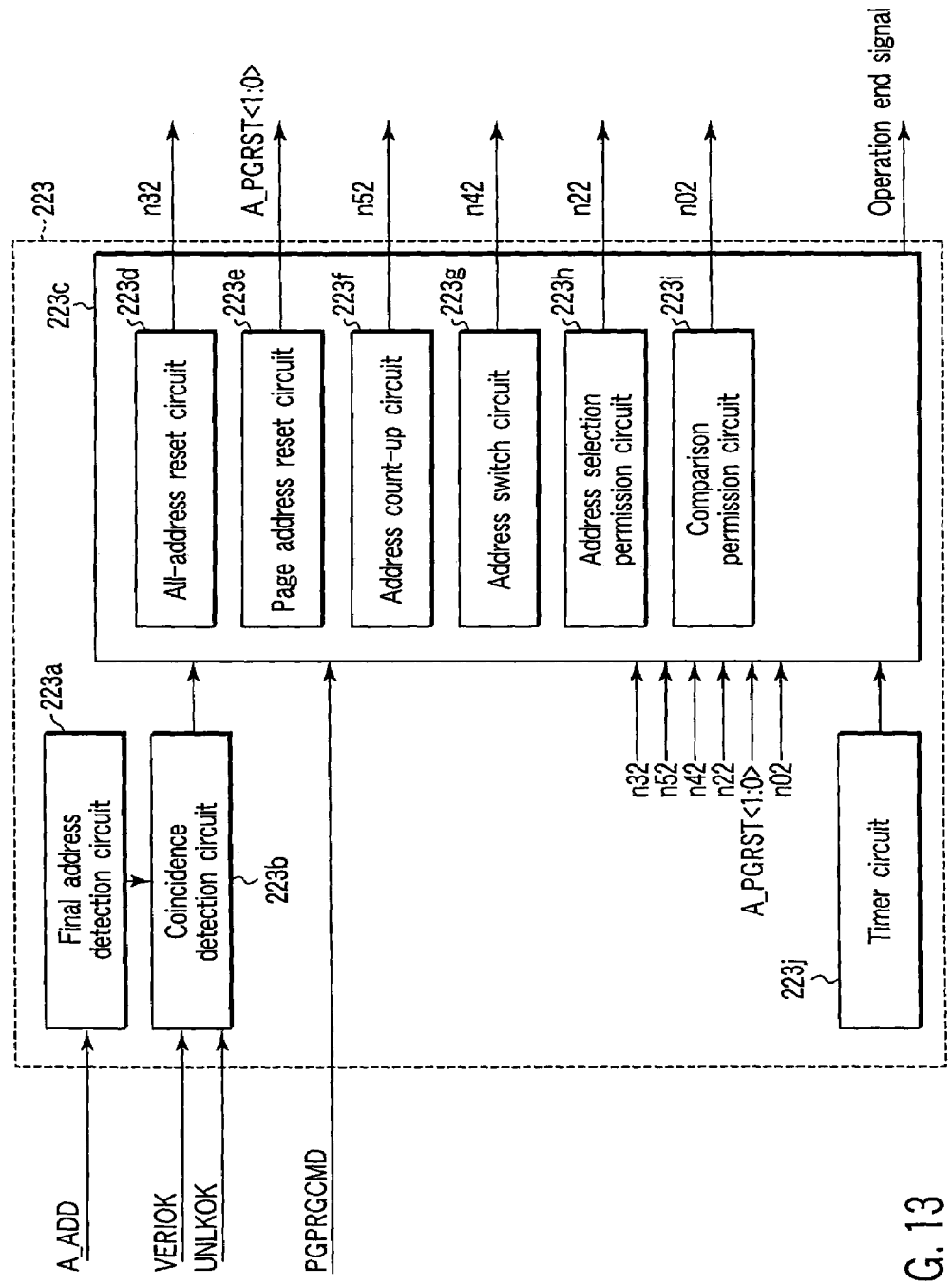
F I G. 13

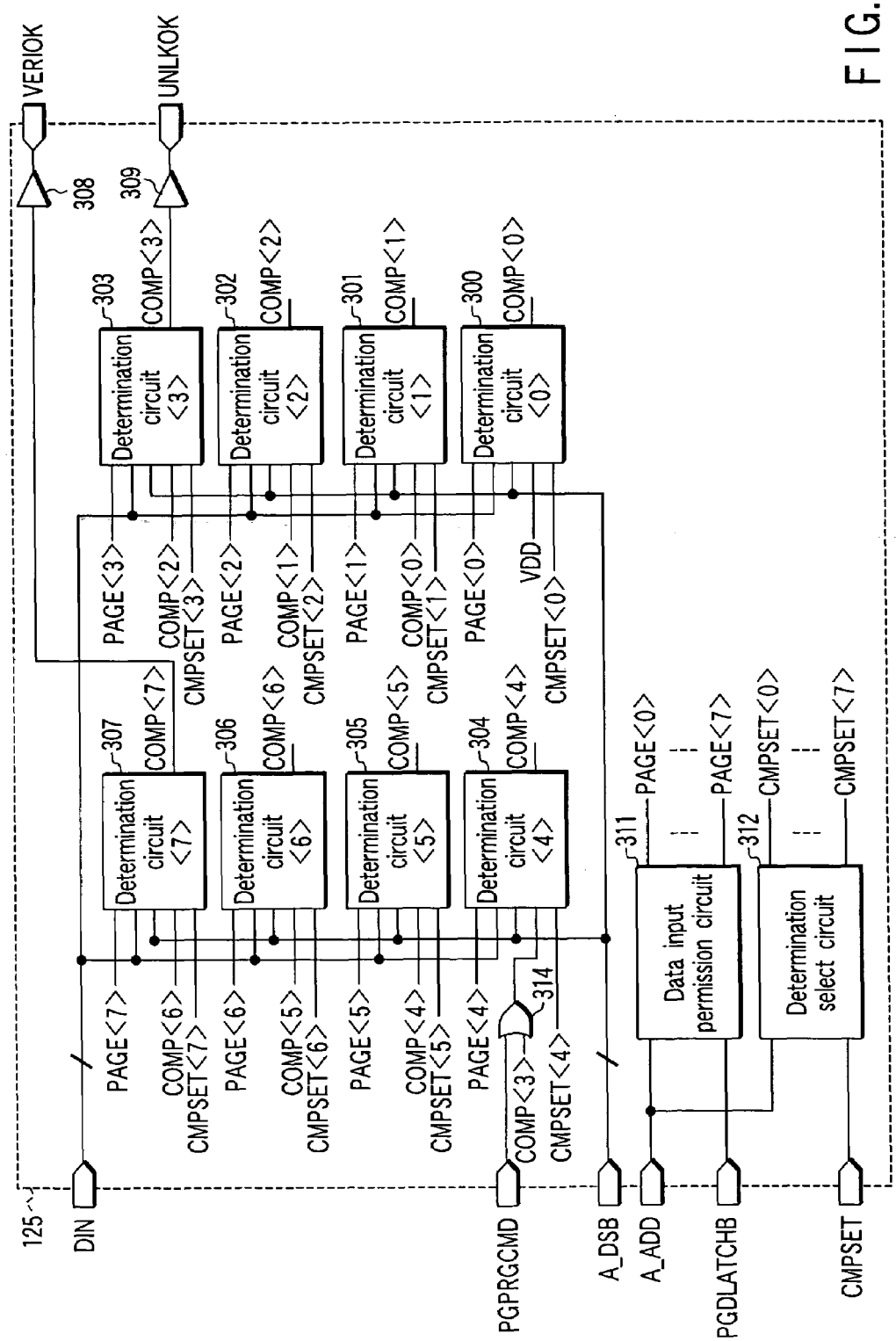
F I G. 15

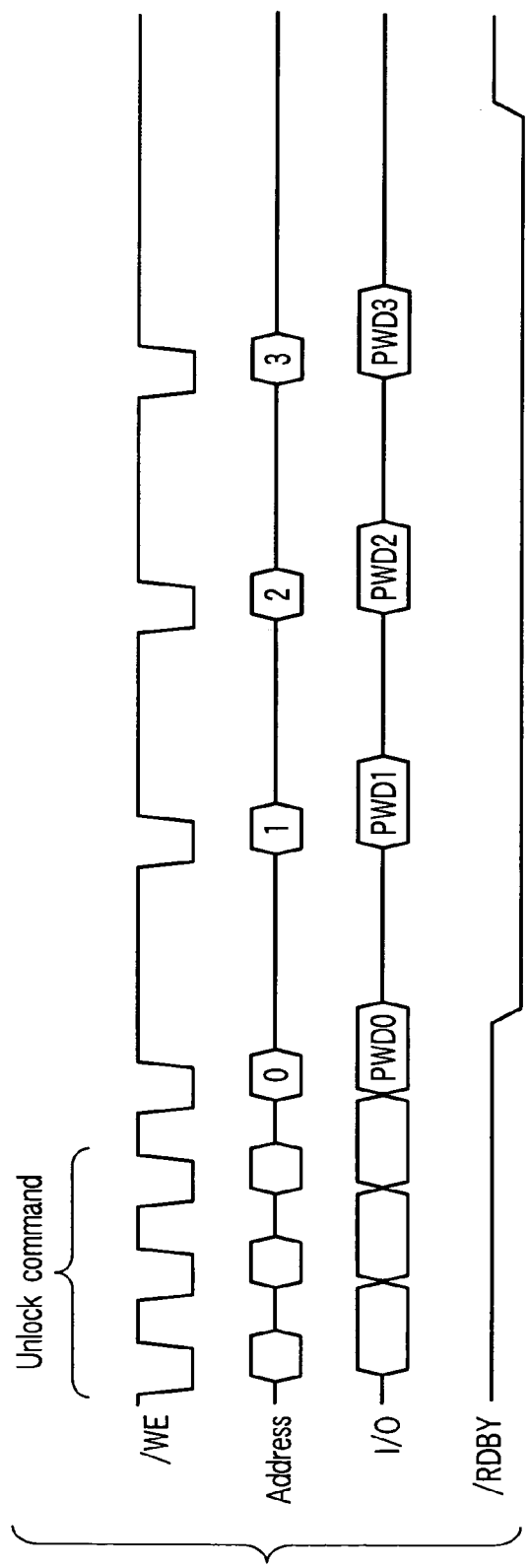
F I G. 21

NONVOLATILE SEMICONDUCTOR MEMORY DEVICE

CROSS-REFERENCE TO RELATED APPLICATIONS

This application is based upon and claims the benefit of priority from prior Japanese Patent Application No. 2004-071475, filed Mar. 12, 2004, the entire contents of which are incorporated herein by reference.

BACKGROUND OF THE INVENTION

1. Field of the Invention

The present invention relates generally to a nonvolatile semiconductor memory device, and more particularly to a nonvolatile semiconductor memory device with a data protection function.

2. Description of the Related Art

In some cases, a nonvolatile semiconductor memory device is used in the state in which the memory area thereof is divided into an instruction code storage area that stores instruction codes of a microcontroller, a CPU, etc., and a user data storage area. In this device, the user data storage area is an area where all of a data write operation, an erase operation and a read operation are executable in accordance with a user's request.

Assume that the nonvolatile semiconductor memory device is mounted, for instance, in a mobile phone and instruction codes are written in the instruction code storage area of the nonvolatile semiconductor memory device at the stage of manufacture. In such a case, in general, setting for prohibiting data write/erase is made in the nonvolatile semiconductor memory device. This prevents the user to change the stored instruction codes. Thereby, even if the nonvolatile memory device goes into an unexpected state due to, e.g. a crash of the CPU, the instruction code storage area is protected and rewrite or erasure of instruction codes can be prevented. In the field of ordinary flash memories, this function is called "write protect" or "protect".

In order to realize the protect function, the following technique, for instance, is adopted. Information on the instruction code storage area is stored in a nonvolatile ROM. The CPU refers to the information in the nonvolatile ROM, and prohibits, e.g. rewrite in the instruction code storage area.

In the meantime, data rewrite in the nonvolatile ROM is also executed by a command that is controlled by the CPU. This requires provision of means for prohibiting data write/ erase in the protect ROM due to an unexpected CPU operation. In usual cases, as regards devices that are mass-produced in factories, etc., protect information is written by a ROM writer, etc. in a nonvolatile ROM that is yet to be mounted on the nonvolatile semiconductor memory device. At this stage, the instruction code storage area is set in the protect state, and only a read-out operation is enabled.

The write of the protect information is realized in the following manner. For example, a predetermined command is input while a voltage (e.g. 12 V) that is higher than a power supply voltage, with which the nonvolatile ROM, when mounted on the nonvolatile semiconductor memory device, operates, is being applied to a predetermined input pin (e.g. reset signal /RESET). Rewrite, etc. in the nonvolatile ROM cannot be effected by other methods.

The nonvolatile ROM, in which the protect information is written, is mounted on, e.g. a printed circuit board by means of soldering. In usual cases, this printed circuit board, on which the nonvolatile ROM is mounted, has no means for applying a high voltage that is necessary for rewrite/erasure in the nonvolatile ROM. Only a voltage that is as high as a power supply voltage (e.g. 3.3 V) can be input to each pin. Thus, the fact that a high voltage cannot be applied after the nonvolatile ROM is mounted on the printed circuit board is the actual means for prohibiting rewrite, etc. in the nonvolatile ROM.

However, with the development in functions of mobile phones, etc. in recent years, there are cases where the nonvolatile ROM needs to be updated due to, e.g. defects in instruction codes of the CPU after the nonvolatile ROM is mounted on the printed circuit board. In addition, there is a demand that rewrite be made in the nonvolatile ROM due to, e.g. an improvement in software after factory shipment. In other words, it becomes necessary to execute write/erasure in the nonvolatile ROM without application of high voltages. To achieve this, it is thinkable to use a so-called password unlock function. According to this function, write/ erasure in the nonvolatile ROM is permitted only when plural-bit password data, which is prestored in a one-time program area prior to factory shipment and cannot be erased by users, coincides with password data that is input from outside.

In order to realize the password unlock function, it is necessary to newly provide the nonvolatile semiconductor memory device with a one-time program area that is not erasable by a user and is different from a memory cell array; a control circuit for reading out password data that is prestored in the one-time program area, when a predetermined command is input; a sense amplifier for sensing the read-out data; a data register that stores, within the chip, password data with a predetermined number of bits, which is input following the input of the predetermined command; and a determination circuit that determines coincidence/ noncoincidence between the read-out data and the input data. This leads to a problem of an increase in chip area of the nonvolatile semiconductor memory device.

Other related art discloses that a password unlock function is executed by additionally providing circuits for detecting the order of input of password data and the coincidence of password data (see Jpn. Pat. Appln. KOKAI Publication No. 2003-132688).

BRIEF SUMMARY OF THE INVENTION

According to an aspect of the present invention, there is provided a nonvolatile semiconductor memory device with a function of executing a verify operation for write data that is input from outside, including: a memory cell array including memory cells arranged in a matrix, and a password storage area for storing password data; an input buffer that receives data input from outside; a first retaining circuit that retains input password data or write data, which is input to the input buffer; a verify sense amplifier that detects, at a time of the verify operation, the password data that is read out of the password storage area or data that is read out of the memory cell array; and a coincidence determination circuit that determines whether the input password data coincides with the read-out password data, or determines whether the write data coincides with the read-out data.

BRIEF DESCRIPTION OF THE SEVERAL VIEWS OF THE DRAWING

FIG. 1 is a block diagram showing the structure of a nonvolatile semiconductor memory device according to a first embodiment of the present invention;

FIG. 8 is a circuit diagram showing the structure of a determination select circuit 312 shown in FIG. 7;

FIG. 11 is a circuit diagram showing the structure of a determination circuit for one bit;

FIG. 12 is a circuit diagram showing the structure of a command permission register 126 shown in FIG. 1;

FIG. 13 is a block diagram showing the structure of a state machine 223 according to a second embodiment of the present invention;

FIG. 15 is a block diagram showing the structure of a data control circuit 125 according to a third embodiment of the present invention;

FIG. 21 is an example of a timing chart in a case where plural password data are input.

DETAILED DESCRIPTION OF THE INVENTION

The inventors of the present invention have developed a nonvolatile semiconductor memory device, as described below, in the process of making the invention.

Figure 18:
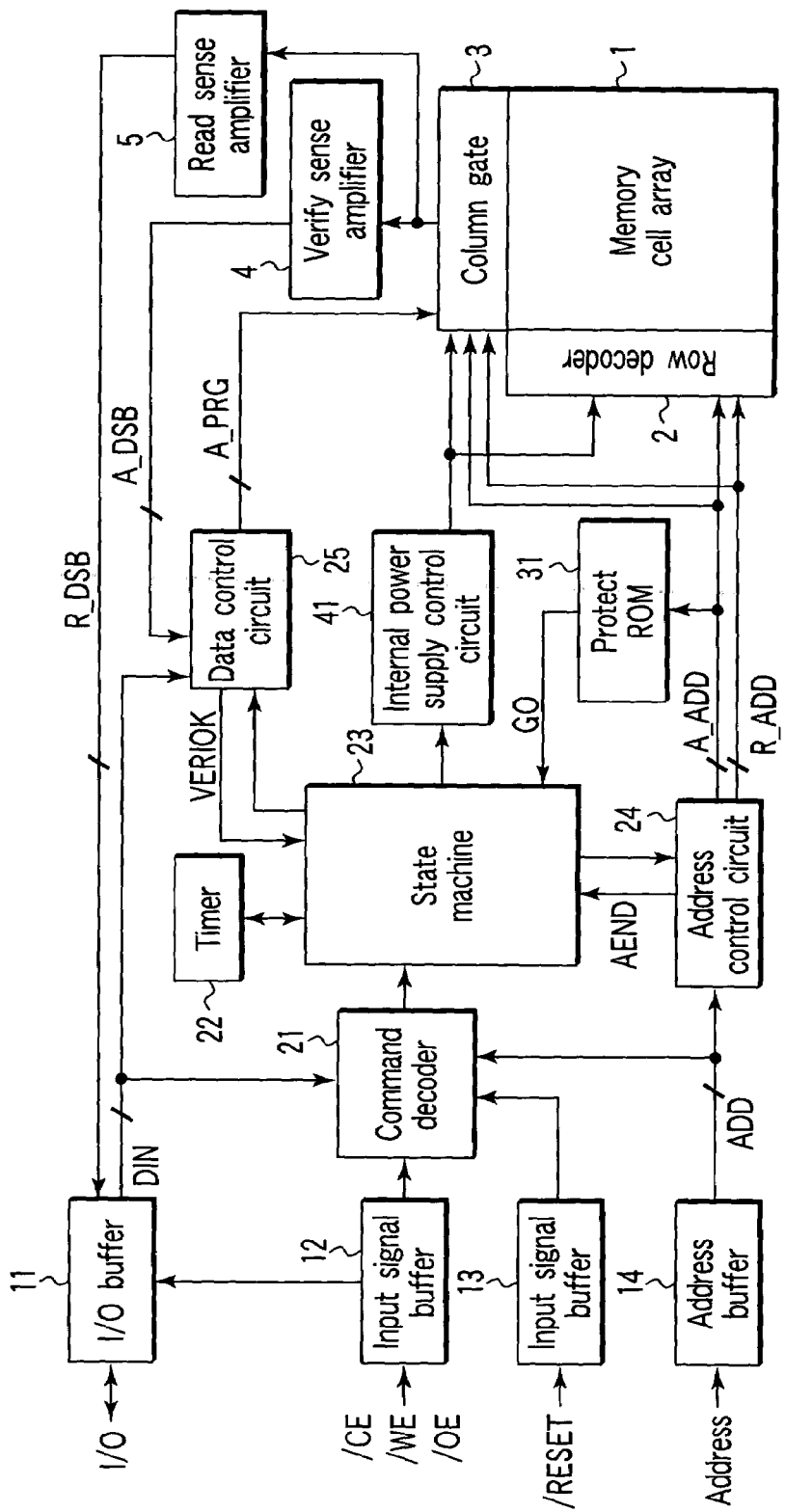
FIG. 18 is a block diagram showing an example of a nonvolatile semiconductor memory device with a protect function.

FIG. 18 is a block diagram showing an example of a nonvolatile semiconductor memory device with a protect function. The nonvolatile semiconductor memory device comprises a memory cell array 1, a row decoder 2, a column gate 3, a verify sense amplifier 4, a read sense amplifier 5, an I/O buffer 11, input signal buffers 12 and 13, an address buffer 14, a command decoder 21, a timer 22, a state machine 23, an address control circuit 24, a data control circuit 25, a protect ROM 31, and an internal power supply control circuit 41.

The nonvolatile semiconductor memory device executes a write, erase or read operation on the basis of a combination of a chip enable signal /CE, an output enable signal /OE and a write enable signal /WE, which are input to the input signal buffer 12 from outside.

The device also executes an operation that enables automatic internal write of data for plural addresses when data for plural addresses are successively input. This operation is referred to as "page write operation" (or referred to also as "page batch write" or "page program"). In this operation, a plurality of write data are retained in a data register that is provided in the data control circuit 25. The write data are automatically written in the memory cell array 1 within the device.

The I/O buffer 11 receives data that is input from outside, or outputs data to a data bus DIN. The input signal buffer 12 receives the chip enable signal /CE, output enable signal /OE and write enable signal /WE, which are input from outside (mark "/" indicates "low active signal"). The input signal buffer 13 receives a reset signal /RESET that is input from outside. The address buffer 14 receives an address that is input from outside.

The command decoder 21 interprets a command that is input from outside. The command decoder 21 activates a predetermined signal on the basis of the interpreted command. The state machine 23 executes various controls including a page write control.

The address control circuit 24 outputs, under control of the state machine 23, the input address ADD as an auto address (i.e. address for automatic operation) A_ADD or a read address R_ADD. In addition, when the last one of addresses of one page is input, the address control circuit 24 activates a final address signal AEND.

The data control circuit 25 controls data that is to be written in the memory cell array 1. In addition, the data control circuit 25 verifies the written data. When the verify operation is normally finished, the date control circuit 25 activates a verify signal VERIOK.

The verify sense amplifier 4 senses data that is read out of the memory cell array 1 in the verify operation, which verifies whether predetermined data is exactly written in a selected memory cell. The verify sense amplifier 4 outputs the sensed read-out data to a bus A_DSB. The read sense amplifier 5 senses data that is read out from the memory cell 1 in an ordinary read operation. The read sense amplifier 5 outputs the sensed read-out data to a bus R_DSB.

The internal power supply control circuit 41 supplies the row decoder 2 and column gate 3 with predetermined voltages that are necessary for reading out data from the memory cell array 1.

In order to realize the protect function, the nonvolatile semiconductor memory device includes a nonvolatile ROM (protect ROM 31) comprising one or more bits for a single erase unit (called "block" or "sector") or for a plurality of erase units. By setting the protect ROM 31 in the protect state, write/erase in the protect area in the memory cell array 1 is prohibited.

The state of the protect ROM 31 is checked each time a write/erase command is issued to the nonvolatile semiconductor memory device. If the protect ROM 31 is in the protect state, write/erase to the block associated with the address is not executed. If the protect ROM 31 is not in the protect state, write/erase to the block associated with the address is executed. This operation is executed by a signal GO that is output from the protect ROM 31. This protect function is realized by hardware and is different from a software protect function.

Figure 19:
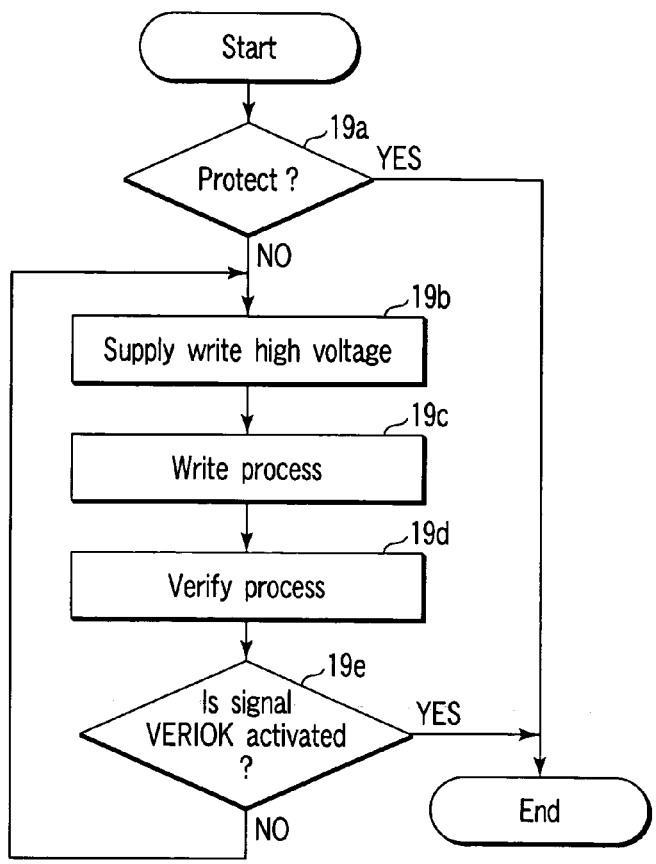
FIG. 19 is a flow chart illustrating a write operation in the nonvolatile semiconductor memory device shown in FIG. 18.

FIG. 19 is a flow chart illustrating a write operation in the nonvolatile semiconductor memory device shown in FIG.

18. The state machine 23 refers to the protect ROM 31 and determines whether an area, in which page write is to be effected, is in the protect state (step 19a). If the area is in the protect state, the state machine 23 finishes the page write operation. On the other hand, if the area is not in the protect state, the state machine 23 controls the internal power supply control circuit 41 and supplies a high voltage for the write operation to the memory cell array 1 (step 19b). The state machine 23 then executes a data write process in the memory cell array 1 (step 19c).

The state machine 23 executes verification of the data written in the memory cell array 1 (step 19d). Next, the state machine 23 monitors whether the verify signal VERIOK is activated (step 19e). If the signal VERIOK is activated, the state machine 23 determines that the write data is exactly written, and completes the write process. If the signal VERIOK is not activated, the state machine 23 repeats the write process.

Figure 20:
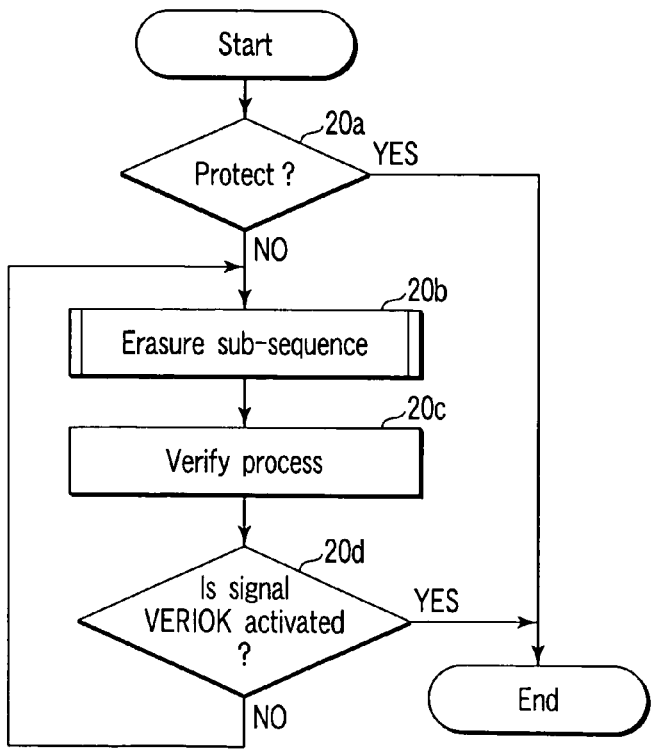
FIG. 20 is a flow chart illustrating an erase operation in the nonvolatile semiconductor memory device shown in FIG. 18.

FIG. 20 is a flow chart illustrating an erase operation in the nonvolatile semiconductor memory device shown in FIG. 18. The state machine 23 refers to the protect ROM 31 and determines whether an area, in which page erase is to be effected, is in the protect state (step 20a). If the area is in the protect state, the state machine 23 finishes the erase operation. On the other hand, if the area is not in the protect state, the state machine 23 executes a conventional erase subsequence (step 20b).

Next, the state machine 23 executes verification of the erased area (step 20c). The state machine 23 then monitors whether the verify signal VERIOK is activated (step 20d). If the signal VERIOK is activated, the state machine 23 determines that the erase operation is exactly executed and completes the erase process. If the signal VERIOK is not activated, the state machine 23 performs the erase operation once again.

An example of a password unlock operation is described. FIG. 21 is a timing chart in a case where a plurality of password data are input. If an unlock command is input, the nonvolatile semiconductor memory device starts the password unlock operation. The input password data (PWD0 to PWD3) are retained within the device and collated with the stored password data. If the password data coincide, rewrite in the protect ROM 31 is enabled.

In the case where the password unlock function is added to the device shown in FIG. 18, a circuit for automatically reading out stored password data and a circuit for automatically collating each password data need to be added in parallel, aside from the configuration for an automatic write operation for ordinary page write or an automatic erase operation. This leads to an increase in chip area of the nonvolatile semiconductor memory device.

Embodiments of the present invention, which are configured based on the above finding, will now be described with reference to the accompanying drawings. In the description below, the parts having the same functions and structures are denoted by like reference numerals, and an overlapping description is omitted, unless where necessary.

First Embodiment

FIG. 1 is a block diagram showing the structure of a nonvolatile semiconductor memory device according to a first embodiment of the present invention. The nonvolatile semiconductor memory device comprises a memory cell array 1, a row decoder 2, a column gate 3, a verify sense amplifier 4, a read sense amplifier (i.e. sense amplifier for read operation) 5, an I/O buffer 11, input signal buffers 12 and 13, an address buffer 14, a command decoder 121, state machines 123 and 223, an address control circuit 124, a data control circuit 125, an auto bank select circuit (i.e. bank select circuit for automatic operation) 101, a read bank select circuit (i.e. band select circuit for read operation) 102, an address select switch 103, OR circuits 104 to 111, a command permission register 126, and a protect ROM 31.

The memory cell array 1 includes a data storage area (data area) and a password data storage area (password area). The memory cell array 1 comprises a plurality of blocks. Data write can be executed in units of a page in a block (e.g. 1 page=8 words, 1 word=16 bits). Data erase can be executed in units of a block as a batch, which comprises a plurality of pages. A plurality of word lines WL (not shown) extending in the row direction and a plurality of bit lines BL (not shown) extending in the column direction are disposed on the memory cell array 1.

The row decoder 2 is connected to the memory cell array 1 via the word lines WL. The row decoder 2 is supplied with a predetermined voltage for driving the word lines WL from an internal power supply control circuit 41 (not shown). The row decoder 2 activates the word lines WL on the basis of addresses.

The column gate 3 is connected to the memory cell array 1 via the bit lines BL. The column gate 3 is supplied with a predetermined voltage from the internal power supply control circuit 41. The column gate 3 selects bit lines BL on the basis of addresses.

The verify sense amplifier 4 senses data that is read out of the memory cell array 1 in the verify operation, which verifies whether predetermined data is exactly written in a selected memory cell. In an ordinary read operation, the read sense amplifier 5 senses data that is read out of the memory cell array 1.

The I/O buffer 11 receives data that is input from outside, or outputs data to a data bus DIN. The input signal buffer 12 receives a chip enable signal /CE, an output enable signal /OE and a write enable signal /WE, which are input from outside (mark "/" indicates "low active signal"). The nonvolatile semiconductor memory device executes write, erase and read operations on the basis of a combination of these control signals. The input signal buffer 13 receives a reset signal /RESET that is input from outside. The address buffer 14 receives an address that is input from outside.

The command decoder 121 interprets a command that is input from outside. The command decoder 21 activates a signal line on the basis of the interpreted command.

The state machine 123 executes a control for the password unlock operation. Specifically, the state machine 123 monitors signals, which the command decoder 121 outputs on the basis of the write enable signal /WE, and reads out a predetermined number of password data prestored in the memory cell array 1, using the monitored signals as transition conditions. The state machine 123 collates the read-out password data, and outputs a collation result.

The state machine 223 executes a page write operation that is a conventional function. The page write operation is an automatic internal write operation for data for plural addresses when data for plural addresses are successively input from outside (this operation is referred to as "page batch write" or "page program"). In this operation, write data for a plurality of addresses are retained in a data register that is provided in the device, and the write data are automatically written in the memory cell array 1 within the device. The page write operation includes a verify operation for verifying whether predetermined data is exactly programmed in a selected memory cell. In the description below, an operation, which is executed during a process from the input of plural data from outside up to the end of verification, is referred to as "auto operation".

At the time of password unlock operation, the address control circuit 124 generates addresses of password data. Under control of the state machine 123, the address control circuit 124 effects switching between the output of the generated addresses and the output of externally input addresses. At the time of the auto operation, other than the password unlock operation, the address control circuit 124 outputs the input address as an auto address A_ADD.

The data control circuit 125 controls data that is to be written in the memory cell array 1. Further, the data control circuit 125 verifies the written data. At the time of the password unlock operation, the data control circuit 125 executes verification between the externally input password data and the password data that is read out of the memory cell array 1.

At the time of the password unlock operation or the auto operation other than the password unlock operation, the auto bank select circuit 101 selects one of the banks in the memory cell array 1 that is divided into one or more banks. The read bank select circuit 102 selects an associated bank at the time of an ordinary read operation.

The address select switch 103 receives an auto bank select signal and a read bank select signal and determines which of an auto address A_ADD and a read address R_ADD is to be transferred to the bank in the memory cell array 1.

The protect ROM 31 stores information relating to a block in which data write/erase is prohibited within the memory cell array 1. That is, the protect ROM 31 stores a protect state. The state in the protect ROM 31 is referred to, each time a write/erase command is issued to the nonvolatile semiconductor memory device. If the area associated with the address is protected, neither write nor erase is executed and the command sequence is finished. On the other hand, if this area is not protected, write/erasure is executed. A notice relating to this operation is effected by a signal GO that is output from the protect ROM 31. If the password unlock is executed, rewrite in the protect ROM 31 is enabled. If the content in the protect ROM 31 is rewritten, a write prohibition area or an erase prohibition area in the memory cell array 1 can be changed.

Figure 2:
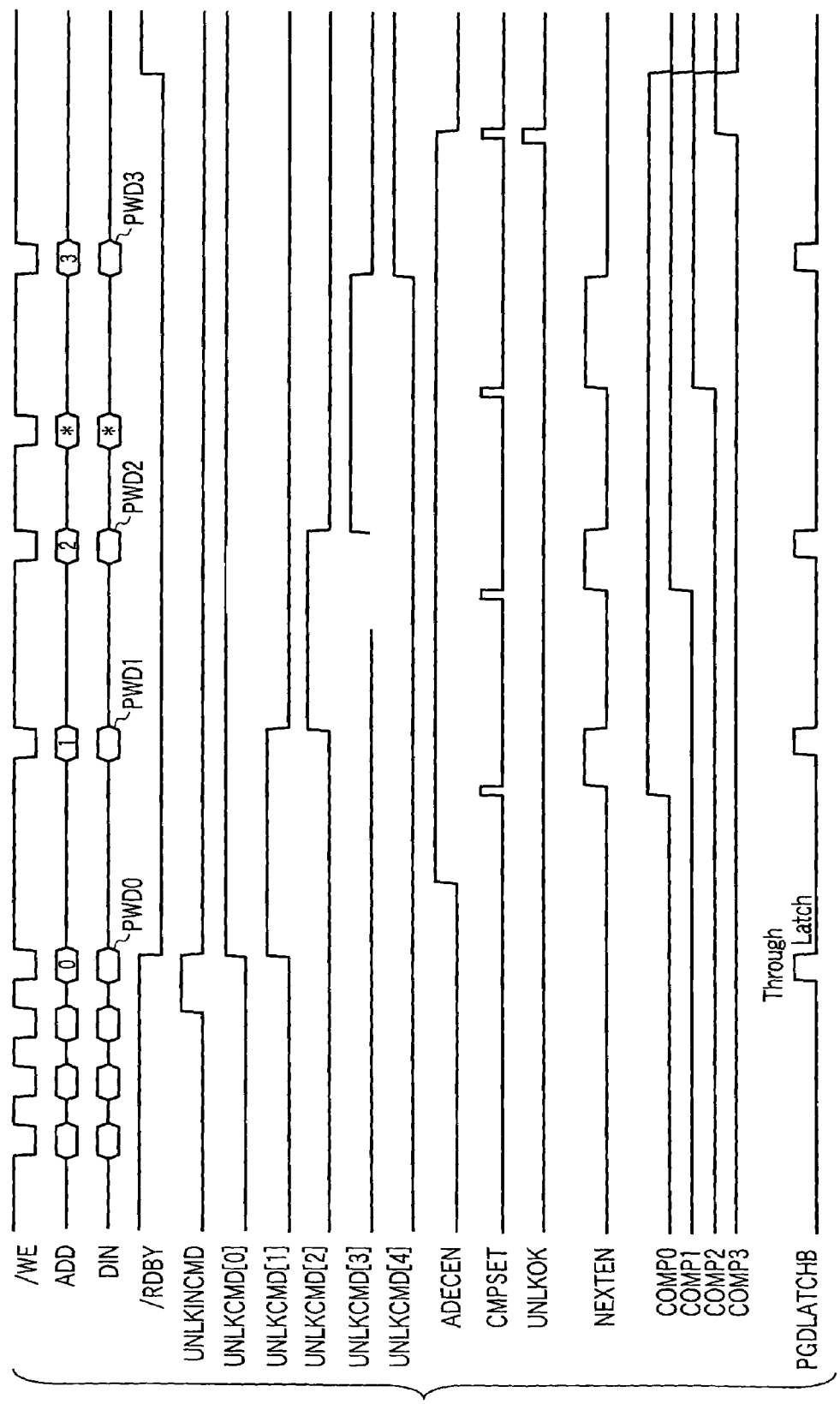
FIG. 2 is a timing chart relating to the nonvolatile semiconductor memory device shown in FIG. 1.

Next, the operation of the nonvolatile semiconductor memory device with the above-described structure is described with reference to FIG. 2. FIG. 2 is a timing chart relating to the nonvolatile semiconductor memory device. In FIG. 2, mark "*" indicates invalid data that is input along with an invalid write enable signal /WE.

To begin with, the operation of the command decoder 121 is described. The command decoder 121 receives an unlock command (in this embodiment, addresses, data and a 3-cycle write enable signal /WE) and activates a password reception permission signal UNLKINCMD. The OR circuit 104 executes logical addition between the signal UNLKINCMD and a data reception permission signal PGINCMD that permits reception of write data by the page write operation that is the conventional function. The OR circuit 104 produces a logical addition output to the data control circuit 125. At the time of the page write operation, the signal UNLKINCMD is not activated, so there is no effect on the conventional function. The unlock command that is input from outside is not limited to the 3-cycle write enable signal /WE. Any signal is usable if the semiconductor memory device can recognize it as the unlock command.

If a write enable signal /WE, which follows the unlock command, is input, the command decoder 121 activates a password unlock operation instruction signal UNLKCMD[0], thereby to start a series of auto operations for collating the externally input password and the internally stored password data. In this embodiment, for example, if a password is divided into first to fourth password data and these password data are input individually, the signal UNLKCMD[0] is activated from the start of the auto operations until the end of the collation of the fourth password data.

At the same time as activating the signal UNLKCMD[0], the command decoder 121 activates a signal UNLKCMD[1] that indicates the collation state of the first password data PWD0. If the next write enable signal /WE is input, the command decoder 121 deactivates the signal UNLKCMD[1] and activates a signal UNLKCMD[2] that indicates the collation state of the second password data PWD1. If the next write enable signal /WE is input, the command decoder 121 deactivates the signal UNLKCMD[2] and activates a signal UNLKCMD[3] that indicates the collation state of the third password data PWD2. If the next write enable signal /WE is input, the command decoder 121 deactivates the signal UNLKCMD[3] and activates a signal UNLKCMD[4] that indicates the collation state of the fourth password data PWD3.

After the password data PWD0 to PWD3 are input and the internal collation is completed, the UNLKCMD[0] to UNLKCMD[4] are deactivated. Thus, the nonvolatile semiconductor memory device finishes the auto operations of the password unlock function. A notice of the completion of the internal auto operations is issued to the outside of the device, for example, by altering the logic of a ready/busy signal /RDBY. Thereby, the external circuit can detect the end of the password unlock operation.

The UNLKCMD[0] to UNLKCMD[4] are used as trigger signals in the password unlock operation. The password unlock operation is controlled by the state machine 123. The state machine 123 is activated only during the password unlock operation. The state machine 123 remains in the inactive state during the conventional functional operation such as the page write operation or page erase operation. Conversely, during the conventional page write operation or page erase operation, the state machine 223 is active and the state machine 123 is inactive.

As described above, the operation start trigger signals for the state machines 223 and 123 are completely separated and also their circuits are completely separated. Hence, for example, even where a transition permission signal of the state machine malfunctions unexpectedly, the password unlock operation is prohibited and the security is enhanced.

Figure 3:
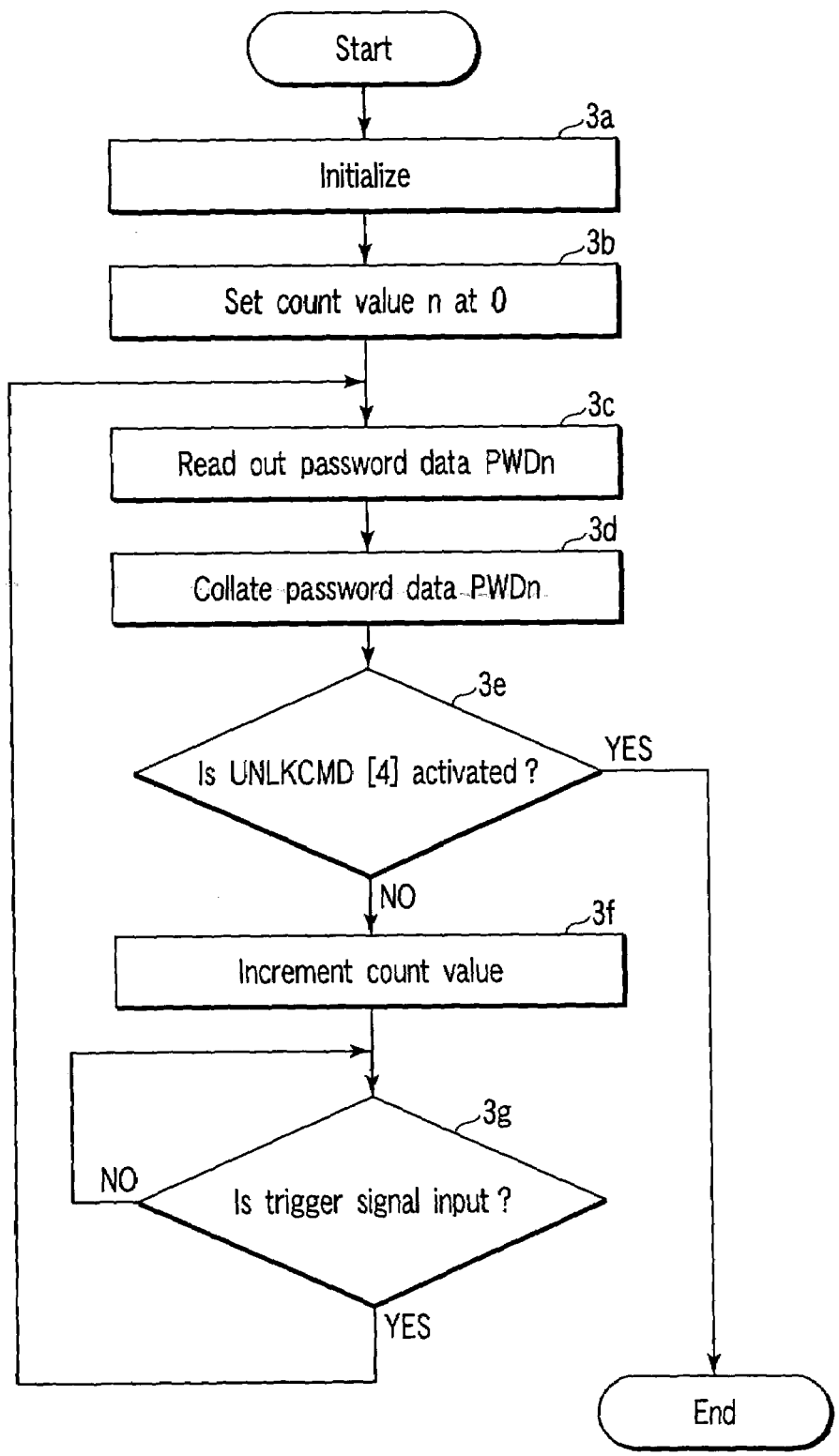
FIG. 3 is a flow chart illustrating the operation of a state machine 123 shown in FIG. 1.

FIG. 3 is a flow chart illustrating the operation of the state machine 123. The state machine 123 initializes the register within the device (step 3a). The state machine 123 then sets the count value n in an address counter 404, which is included in the address control circuit 124, to "0" (step 3b). Next, the state machine 123 executes a control to read out the password data PWDn from the memory cell array 1 (step 3c). The state machine 123 then executes a control to collate externally input password data PWDn and the password data PWDn that is read out of the memory cell array 1 (step 3d).

Subsequently, the state machine 123 monitors whether or not the signal UNLKCMD[4], which indicates that the signal UNLKCMD input from the command decoder 121 is in the collation state of the last password data PWD3, is activated (step 3e). If the signal UNLKCMD[4] is not activated, the state machine 123 increments the count value n by 1 in the address counter circuit 404 (step 3f).

The state machine 123 monitors the inputting of a trigger signal (UNLKCMD signal in this embodiment) that changes when the write enable signal /WE is input (step 3g). If the input of the trigger signal is detected, the state machine 123 executes a control to read out the next password data PWDn+1 from the memory cell array 1 (step 3c). Thereafter, the state machine is 123 repeats the read-out and collation operations. If the signal UNLKCMD[4] is activated in step 3e, the state machine 123 completes the process.

Figure 4:
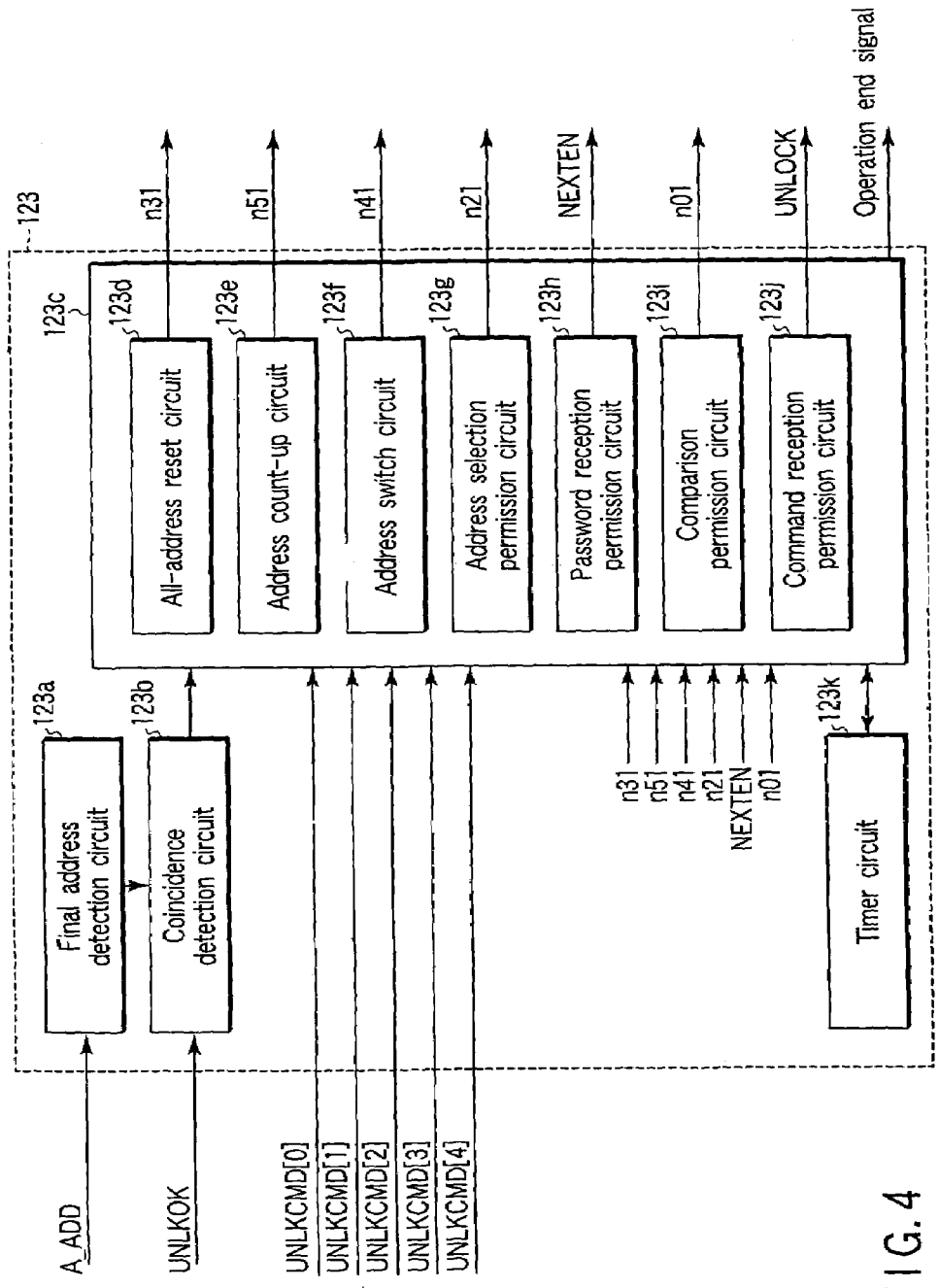
FIG. 4 is a block diagram showing the structure of the state machine 123 shown in FIG. 1.

FIG. 4 is a block diagram showing the structure of the state machine 123. The state machine 123 includes a final address detection circuit 123a, a coincidence detection circuit 123b, an operation detection circuit 123c, and a timer circuit 123k.

The operation detection circuit 123c detects the state of progress of the password unlock operation. Based on the detected state of progress, the operation detection circuit 123c generates control signals necessary for the next operation. The operation detection circuit 123c includes an all-address reset circuit 123d, an address count-up circuit 123e, an address switch circuit 123f, an address selection permission circuit 123g, a password reception permission circuit 123h, a comparison permission circuit 123i, and a command reception permission circuit 123j.

Prior to the start of the password unlock operation, signals that are output from the state machine 123 are in the inactive state. The state machine 123 starts to operate, upon detecting that the signal UNLKCMD[0] or UNLKCMD[1] from the command decoder 121 is activated. The state machine 123 is in the operative state while the signal UNLKCMD[0] is in the active state.

If the signal UNLKCMD[0] is activated, the all-address reset circuit 123d activates an all-address reset signal n31. The signal n31 is input, as an all-address reset signal A_ADDRST, via an OR circuit 109 to the address counter circuit 404 that is included in the address control circuit 124.

If the signal UNLKCMD[0] is activated, the address switch circuit 123f activates an address switch signal n41 that effects switching to an address generated by the address control circuit 124. The signal n41 is input, as an address switch signal CUTIN, via the OR circuit 108 to the address control circuit 124.

If the signal UNLKCMD[O] is activated, the address selection permission circuit 123g activates a signal n21 that renders effective the address signal line for auto operation. The signal n21 is input, as an address line activating signal ADECEN, via the OR circuit 107 to the auto bank select circuit 101.

If the signal UNLKCMD[O] is activated, the password reception permission circuit 123h activates the timer circuit 123k. The timer circuit 123k may be a timer circuit that is used only at the time of the password unlock operation, or a timer circuit that doubles as a timer circuit for use in the auto operation, although not shown. The password reception permission circuit 123h keeps a next-password reception permission signal NEXTEN in the inactive state, until the timer circuit 123k issues a notice to the effect that a predetermined time period has passed. This predetermined time period is determined on the basis of the word length of the password data and other design specifications.

If the timer circuit 123k has counted a predetermined time period, the timer circuit 123k delivers to the operation detection circuit 123c a signal that is indicative of the passage of the predetermined time period. If this signal is activated, the comparison permission circuit 123i activates a password comparison start signal n01 by only one pulse. This pulse signal n01 is input to the data control circuit 125.

If the pulse signal n01 is detected, the password reception permission circuit 123h activates the signal NEXTEN so as to permit reception of the next password data PWD1 from outside. In addition, if the pulse signal n01 is detected, the address switch circuit 123f executes a control to deactivate the signal n41 and to effect switching to an externally input address. The address switch circuit 123f keeps this state until the next password data PWD1 is input.

If the next password data PWD1 is input from outside, the UNLKCMD[1] that is output from the command decoder 121 is deactivated and, at the same time, the signal UNLKCMD[2] is activated. If the signal UNLKCMD[2] is activated, the address switch circuit 123f executes a control to activate the signal n41 and to effect switching to an address that is generated by the address control circuit 124.

If the signal UNLKCMD[2] is activated, the address count-up circuit 123e activates a count-up signal n51 by one pulse. The pulse signal n51 is input, as a count-up signal A_ADDADV, via the OR circuit 110 to the address counter circuit 404 that is included in the address control circuit 124. Thereby, the address counter circuit 404 increments the count value by, e.g. a binary data value "1."

If the signal UNLKCMD[2] is activated, the password reception permission circuit 123h deactivates the signal NEXTEN and, at the same time, activates the timer circuit 123k. The password reception permission circuit 123h keeps the signal NEXTEN in the deactivated state until a signal indicative of the passage of a predetermined time period is input from the timer circuit 123k.

Subsequently, the state machine 123 repeats a predetermined number of times the series of operations comprising the detection of passage of a predetermined time period by the timer circuit 123k, the password data collation and the wait for input of next password data.

If the last password data PWD3 (the fourth password data in this embodiment) is input from outside, the signal UNLKCMD[3] that is input from the command decoder 121 is deactivated and the signal UNLKCMD[4] is activated. The other operations and the operations up to the generation of the password comparison start signal n01 are the same as described above.

Although not shown, the operation timing of the state machine 123 is determined in sync with the rising or falling of a reference clock signal that is generated internally or externally. Alternatively, the state machine 123 may be a circuit that generates the next signal with a given time period after detection of the signal output from the command decoder 121 or the signal generated by the state machine 123.

Next, the operation of the address control circuit 124 is described. The semiconductor memory device includes a password storage area for storing password data within the memory cell array 1. The password storage area is disposed as an area in a block, which is different, at least, from the block of the writable/erasable area. The password storage area may be configured to have a cell array structure that includes no area other than the area for the password address. Alternatively, an address area, other than the area for password data, may be configured to store user data that permits read-out alone by the user. Moreover, the area, other than the area for password data, may be configured to permit write, additional write and read-out by the user. Means for prohibiting erasure of password data in the password storage area may be realized by any method.

The address control circuit 124 is configured to prohibit read-out of password data by the input of an external command, after the password data is written. The data protection level is secured by configuring the address control circuit 124 such that read-out of password data is permitted only by the control signal produced by the state machine 123.

Figure 5:
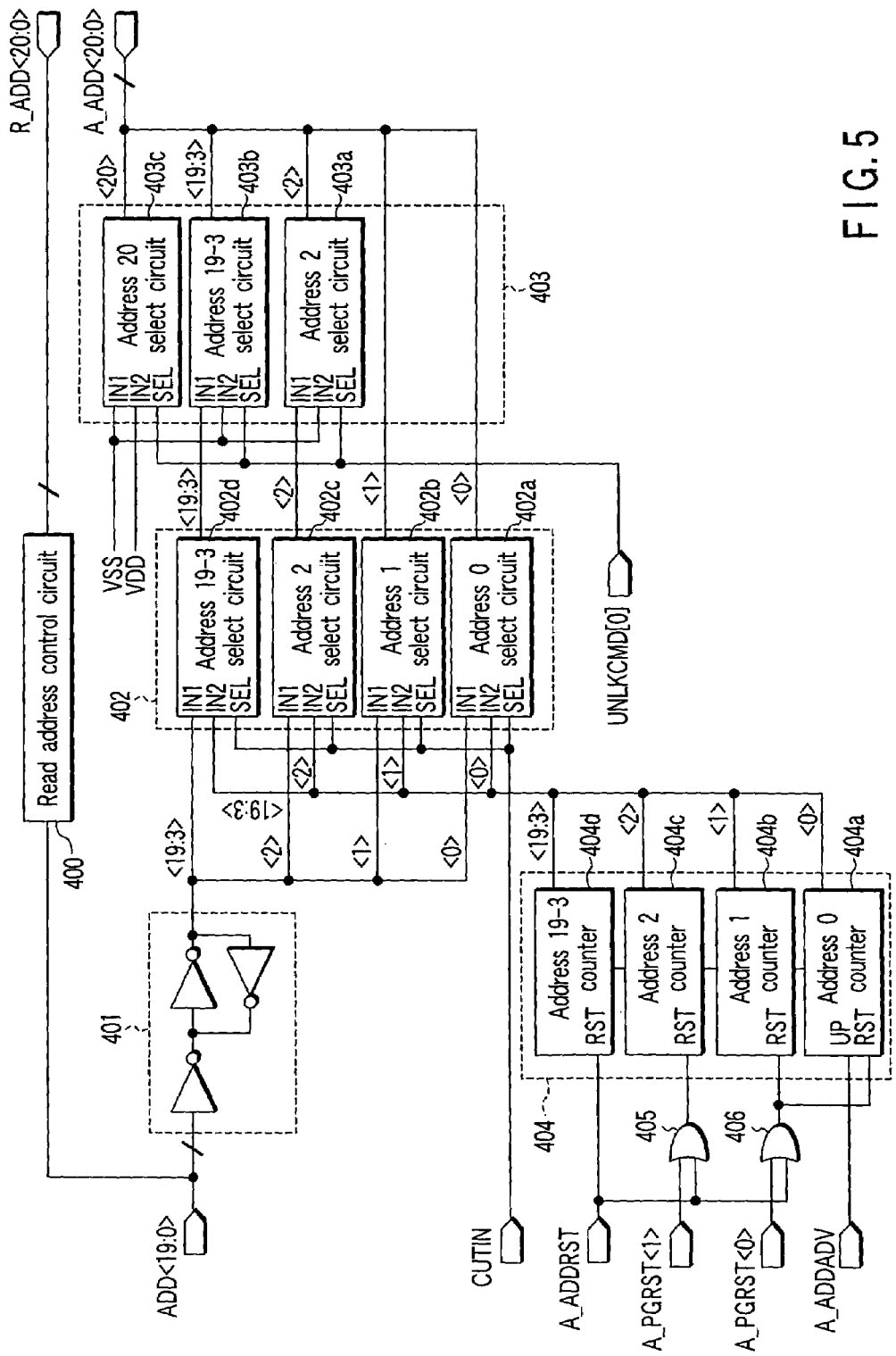
FIG. 5 is a block diagram showing the structure of an address control circuit 124 shown in FIG. 1.

FIG. 5 is a block diagram showing the structure of the address control circuit 124. The address control circuit 124 includes a read address control circuit 400, an address latch circuit 401, an address select circuit 402, an address select circuit 403 and an address counter circuit 404. Of these circuits, the address latch circuit 401, address select circuit 402 and address counter circuit 404 are conventional circuits for use in the page write operation.

The read address control circuit 400 is a conventional circuit for use in the data read operation. The read address control circuit 400 operates at the time of normal data read. The read address control circuit 400 outputs an input address as a read address R_ADD.

An address ADD <19:0> that is input to the address control circuit 124 is delivered to the address latch circuit 401. In this embodiment, the address ADD comprises, e.g. 20 bits. The address latch circuit 401 comprises three inverter circuits and latches the address ADD <19:0> that is input from the address buffer 14. The timing of latching is controlled on the basis of the write enable signal /WE, although not shown.

The address ADD <19:0> that is output from the address latch circuit 401 is input to the address select circuit 402. Specifically, the 0-th bit of the address ADD <19:0> is input to an input terminal IN1 of an address 0 select circuit 402a. The first bit of the address ADD <19:0> is input to an input terminal IN1 of an address 1 select circuit 402b. The second bit of the address ADD <19:0> is input to an input terminal IN1 of an address 2 select circuit 402c. The third to 19th bits of the address ADD <19:0> is input to an input terminal IN1 of an address 19-3 select circuit 402d.

When the count-up signal A_ADDADV is activated, the address counter circuit 404 counts up the address. Specifically, when one pulse of the count-up signal A_ADDADV is input, the address counter circuit 404 counts up the counter value by, e.g. a binary data value "1." The address counter circuit 404 outputs the count value as an address in accordance with the number of times of input of the count-up signal A_ADDADV.

The count-up signal A_ADDADV that is output from the state machine 123 is input to a count-up terminal UP of an address 0 counter 404a. The all-address reset signal A_ADDRST that is input from the state machine 123 is delivered via an OR circuit 406 to reset terminals RST of the address 0 counter 404a and an address 1 counter 404b. The signal A_ADDRST is also delivered via an OR circuit 405 to a reset terminal RST of an address 2 counter 404c. In addition, the signal A_ADDRST is delivered to a reset terminal RST of an address 19-3 counter 404d.

The above-described circuit configuration of the address counter circuit 404 is merely an example. The configuration is not limited to this. For example, a publicly known ripple carry counter circuit or carry lookahead counter circuit may be adopted.

A 0-th bit of a reset signal A_PGRST <1:0> that is output from the state machine 223 is input via the OR circuit 406 to the reset terminals RST of the address 0 counter 404a and address 1 counter 404b. A first bit of the reset signal A_PGRST <1:0> is input to the reset terminal RST of the address 2 counter 404c via the OR circuit 405.

If the all-address reset signal A_ADDRST is activated, the address counter circuit 404 resets the count value. If the signal A_PGRST <0> is activated, the address counter circuit 404 resets the address counters for the low-order four addresses of the eight addresses. If the signal A_PGRST <1> is activated, the address counter circuit 404 resets the address counters for the high-order four addresses of the eight addresses.

The address that is output from the address counter 404 is input to the address select circuit 402. Specifically, a 0-th bit of the address count value is delivered to an input terminal IN2 of the address 0 select circuit 402a. A first bit of the address count value is delivered to an input terminal IN2 of the address 1 select circuit 402b. A second bit of the address count value is delivered to an input terminal IN2 of the address 2 select circuit 402c. Third to 19th bits of the address count value are delivered to an input terminal IN2 of the address 19-3 select circuit 402d.

The address select circuit 402 selects one of the address, which is input from the address latch circuit 401 to the input terminals IN1, and the address, which is input from the address counter circuit 404 to the input terminals IN2. This select operation is performed based on the address switch signal CUTIN that is input to select terminals SEL. When the signal CUTIN is activated, the address select circuit 402 selects the address that is input from the address counter circuit 404.

The address that is output from the address select circuit 402 is input to the address select circuit 403. Specifically, a second-bit address that is output from the address 2 select circuit 402c is input to an address 2 select circuit 403a. The third to 19th bit addresses, which are output from the address 19-3 select circuit 402d, are input to an address 19-3 select circuit 403b.

The address select circuit 403 executes a select operation so as to output an address that indicates the password storage area at the time of the password unlock operation, and the user data storage area at the time of the auto operation, other than the password unlock operation. This select operation is performed based on the signal UNLKCMD[0] that is input to select terminals SEL.

In this embodiment, the highest-order 21st bit of address bus bits is assigned to the address line that indicates the password storage area. By activating the address line, it is indicated that the associated address indicates the password storage area. The 21st bit address line signal is activated during the password unlock operation. When the signal UNLKCMD[0] is activated, an address 20 select circuit 403c outputs "1" data (power supply voltage VDD).

The address 2 select circuit 403a and address 19-3 select circuit 403b output "0" data (ground voltage VSS) when the signal UNLKCMD[0] is activated, and output the addresses, which are input from the address select circuit 402, as such in other cases. The low-order two-bit address is representative of the password data address, and is a signal indicative of the number of times of input of password data. Thereby, it becomes possible to determine whether the password data have been input from outside in a predetermined order beginning with address "0".

Next, the password data read-out operation is described. If the signal UNLKCMD[0] is activated, the state machine 123 activates the signal n21. The OR circuit 107 produces a logical sum between the signal n21 and a signal n22 that is output from the state machine 223 and enables the address signal line for auto operations. The logical sum is input as the signal ADECEN to the auto bank select circuit 101. The auto bank select circuit 101 interprets the auto address A_ADD that is output from the address control circuit 124, and generates a bank select signal that is selected in the auto operation.

If the signal ADECEN is activated, the auto bank select circuit 101 forcibly activates a password bank select signal APWBNK in order to enhance the protection level. When the user selects, by the auto operation, the user data storage area that is normally accessed, the auto bank select circuit 101 activates only a conventional auto bank select signal ABANK so that the password storage area may not be selected. The bank select signal is activated exclusively, and a plurality of signal lines are not activated at a time. In order to realize a dual operation that executes a read-out operation during execution of the auto operation, the conventional read bank select circuit 102 is provided in parallel.

Figure 6:
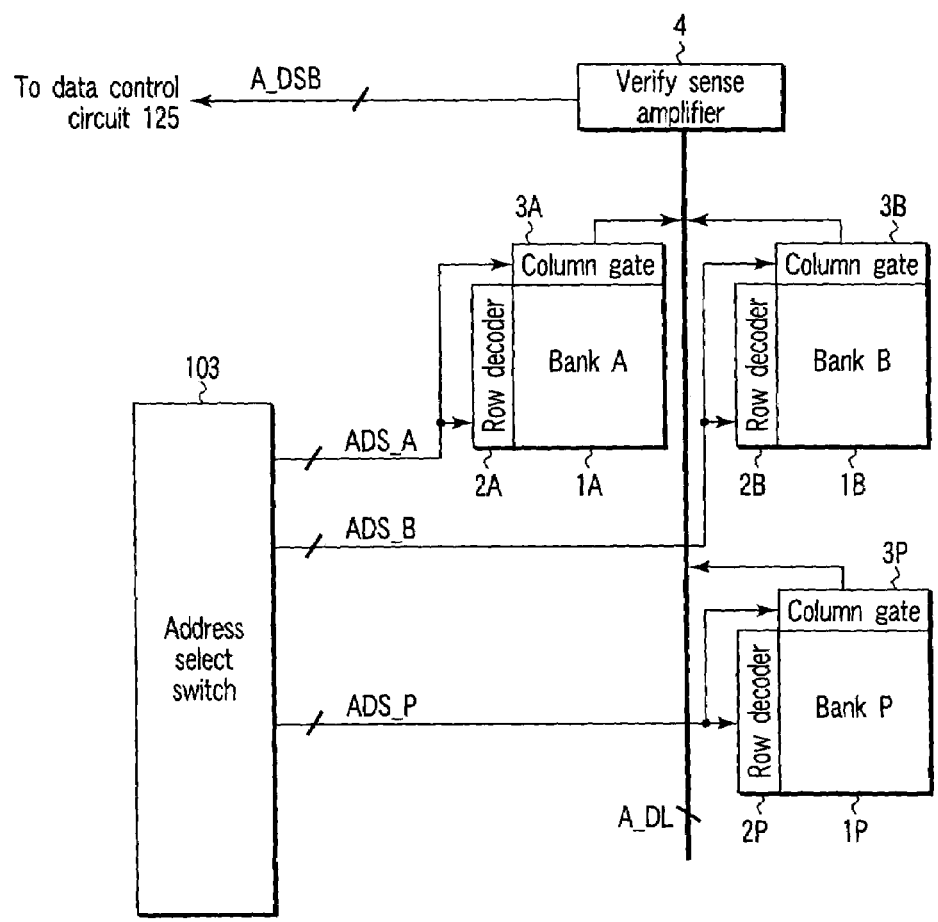
FIG. 6 is a view for explaining a method of selecting a bank in a memory cell array 1.

The address select switch 103 receives the auto and read bank select signals and determines which of the auto address A_ADD and the read address R_ADD is to be transferred to the bank within the memory cell array 1. Referring to FIG. 6, a method of bank selection is described. Assume that the user data storage areas are a bank A and a bank B, and the password storage area is a bank P. The number of banks is not essential in the present invention, so it is not specified.

In the password unlock operation, an address A_ADD is output to an address bus ADS_P. The address A_ADD is transferred to a row decoder 2P and a column decoder 3P of the bank P. The internal power supply control circuit 41 (not shown) supplies the row decoder 2P and column decoder 3P with predetermined voltages that are necessary for read-out of data corresponding to the transferred address. Password data that is read out of the bank P is transferred via the column gate 3P to an auto data bus A_DL.

The data bus A_DL is a bus, through which data is transferred in a conventional write/erase verify operation. By transferring the password data to the data bus A_DL, the aforementioned dual operation is enabled during the password unlock operation. In addition, the use of the conventional bus realizes the password unlock operation without increasing the bus area. Data relating to a read operation is transferred to a read data bus R_DL (not shown).

The password data that is transferred to the bus A_DL is input to the verify sense amplifier 4. The verify sense amplifier 4 senses a small potential difference between a predetermined reference potential and a potential corresponding to the password data read out of the bank P. If the reference potential is higher, "1" data is determined. If the reference potential is lower, "0" data is determined. The verify sense amplifier 4 outputs the sensed password data to the bus A_DSB. This sense operation is controlled by a control signal that is activated by the state machine 123, although not shown. Alternatively, a control circuit, which is provided outside the state machine 123, may produce a predetermined control signal.

Next, the password data verify operation is described. The data control circuit 125 executes verification between the password data read out of the memory cell array 1 and the password data input from outside, on the basis of a control signal that is output from the state machine 123. This control signal comprises a comparison permission signal CMPSET that is output from the OR circuit 106 as a logical sum between the password comparison start signal n01 output from the state machine 123 and a verify comparison permission signal n02 output from the state machine 223. A control signal for verification by a conventional auto operation is configured such that the signal n02 is sent as signal CMPSET to the data control circuit 125.

Figure 7:
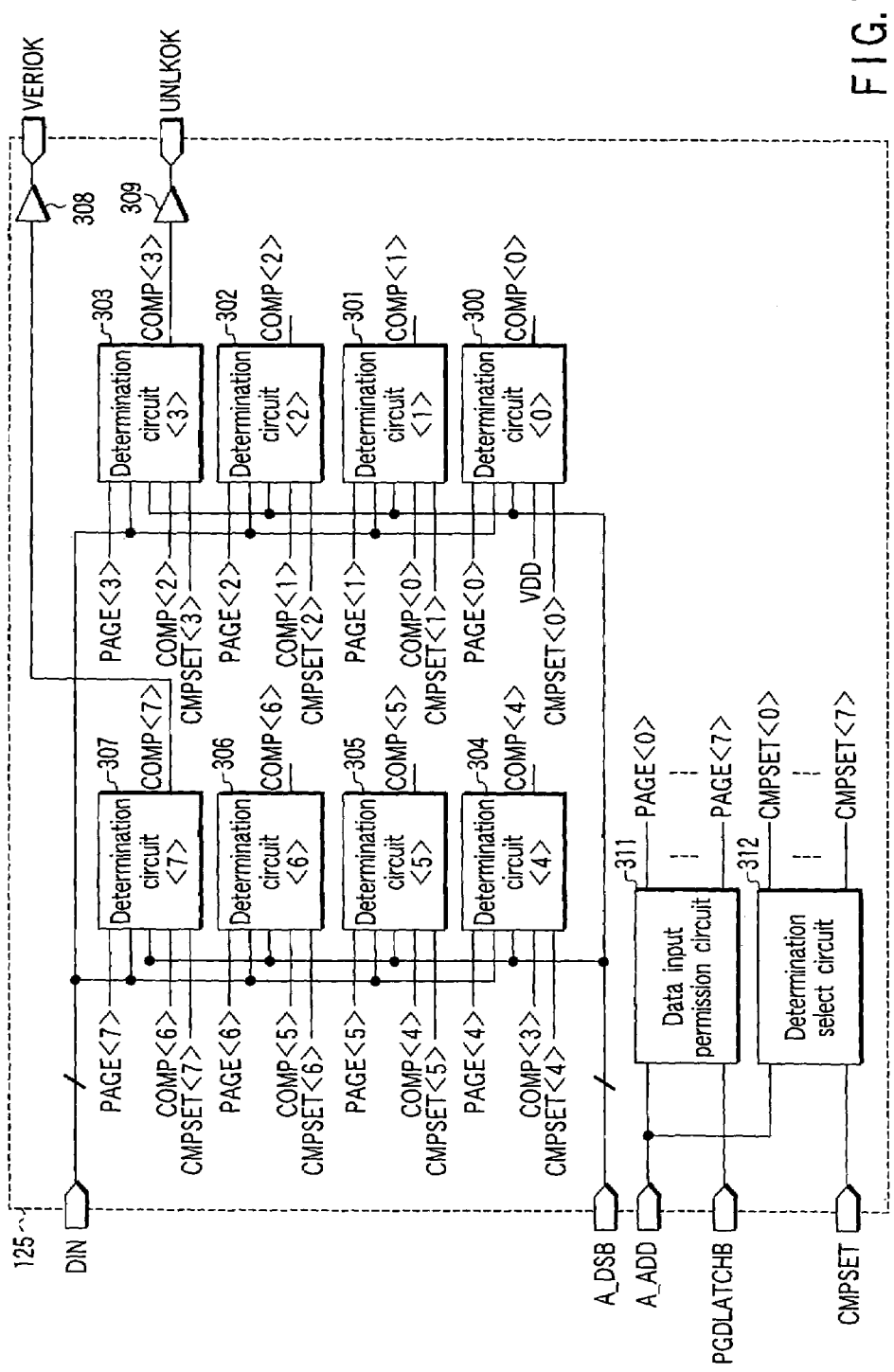
FIG. 7 is a block diagram showing the structure of a data control circuit 125 shown in FIG. 1.

FIG. 7 is a block diagram showing the structure of the data control circuit 125. The data control circuit 125 includes a plurality of determination circuits 300 to 307, a data input permission circuit 311, a determination select circuit 312, and buffers 308 and 309. Each of the determination circuits 300 to 307 includes a data register and a verify register.

The data control circuit 125 performs conventional operations. That is, the data control circuit 125 stores data in a data register that is designated by an address provided along with the write enable signal /WE, and executes verification between the data stored in the data register and data that is read out of the memory cell array 1 by the auto operation. When a page write operation is performed, the data control circuit 125 has determination circuits corresponding to addresses of one page. In this embodiment, one page comprises eight words. Thus, the data control circuit 125 has eight determination circuits 300 to 307. In this embodiment, some or all of the determination circuits 300 to 307, which are used in the page write operation, are also used in the password unlock operation.

The data control circuit 125 outputs an unlock permission signal UNLKOK and a verify signal VERIOK. The signal UNLKOK is output via the buffer 309. The signal VERIOK is output via the buffer 308.

The data input permission circuit 311 generates data storage permission signals PAGE<0> to PAGE<7>, which permit data storage in the associated data register on the basis of the externally input address. The timing of generation of signals PAGE<0> to PAGE<7> is controlled by a data latch signal PGDLATCHB. In the page write operation that is the conventional function, the data input permission circuit 311 outputs the data storage permission signals PAGE<0> to PAGE<7> when the data reception permission signal PGINCMD is input via the OR circuit 105 as the signal PGDLATCHB.

On the other hand, in the password unlock operation, the data input permission circuit 311 outputs the data storage permission signals PAGE<0> to PAGE<7> when the password reception permission signal UNLKINCMD or the next-password reception permission signal NEXTEN is input as the signal PGDLATCHB. The signals PAGE<0> to PAGE<7> are input to the determination circuits 300 to 307, respectively.

For example, in the case where the lower-order three bits of the address A_ADD are (A_ADD<2>, A_ADD<1>, A_ADD<0>)=(0, 0, 0), the data input permission circuit 311 activates the signal PAGE<0> and deactivates the other signals PAGE<1> to PAGE<7>. Where the lower-order three bits of the address A_ADD are (A_ADD<2>, A_ADD<1>, A_ADD<0>)=(1, 1, 1), the data input permission circuit 311 activates the signal PAGE<7> and deactivates the other signals PAGE<0> to PAGE<6>.

FIG. 8 is a circuit diagram showing the structure of the determination select circuit 312. The determination select circuit 312 comprises NOR circuits 320 to 323, NAND circuits 324 to 335, and inverter circuits 336 to 353. Symbol A_ADD<0> indicates a 0-th bit signal of the address A_ADD, A_ADD<1> indicates a first-bit signal of the address A_ADD, and A_ADD<2> indicates a second-bit signal of the address A_ADD.

The determination select circuit 312 generates comparison permission signals CMPSET<0> to CMPSET<7>, which permit comparison on the basis of the address that is generated by the address counter circuit 404. For example, if the low-order three bits of the address A_ADD are (A_ADD<2>, A_ADD<1>, A_ADD<0>)=(0, 0, 0), the determination select circuit 312 activates the comparison permission signal CMPSET<0> and deactivates the other signals CMPSET<1> to CMPSET<7>. Only when the comparison permission signal CMPSET is activated, does the determination select circuit 312 activate the signals CMPSET<0> to CMPSET<7>. The signals CMPSET<0> to CMPSET<7> are input to the determination circuits 300 to 307, respectively.

Figure 9:
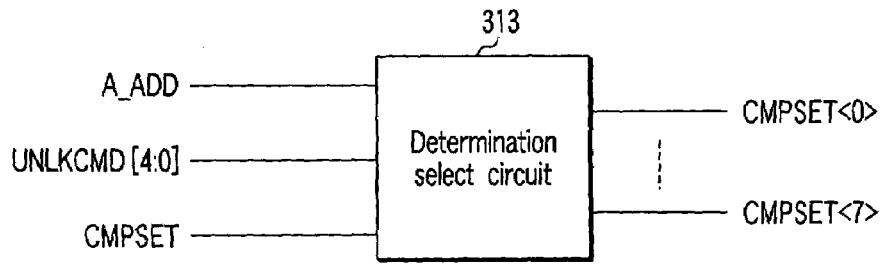
FIG. 9 shows another example of the structure of the determination select circuit.
Figure 10:
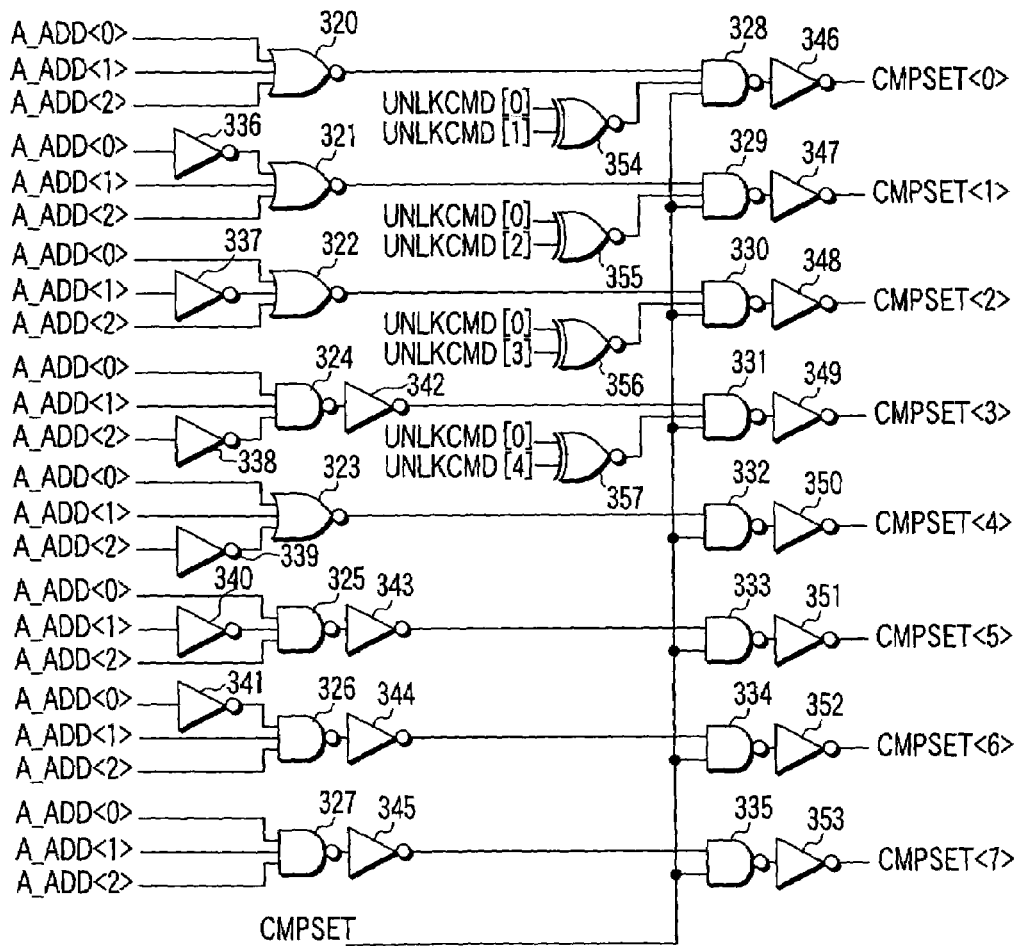
FIG. 10 is a circuit diagram showing the structure of the determination select circuit 313 shown in FIG. 9.

FIG. 9 shows another example of the structure of the determination select circuit. The data control circuit 125 may include a determination select circuit 313. The determination select circuit 313 receives signals UNLKCMD[4:0] (comprising the UNLKCMD[0], UNLKCMD[1], UNLKCMD[2], UNLKCMD[3] and UNLKCMD[4]). FIG. 10 is a circuit diagram showing the structure of the determination select circuit 313. The determination select circuit 313 includes exclusive-NOR (XNOR) circuits 354 to 357, in addition to the structure of the determination select circuit 312.

In a case where the address control circuit 124 does not include the address counter circuit 404 that stores the number of times of password input, the determination select circuit 313 transmits the comparison permission signals CMPSET<0> to CMPSET<7> to the associated determination circuits 300 to 307, making use of the feature that the signals UNLKCMD[0] to UNLKCMD[4] output from the command decoder 121 are signals indicative of the number of times of password input. Hence, if the password data are not input from outside in a successive order, coincidence signals COMP<0> to COMP<7> are not activated. For example, the signal CMPSET<0> is activated when the signals UNLKCMD[0] and UNLKCMD[1] are activated.

In the case where the data control circuit 125 includes the determination select circuit 313 with the above-described structure, the state machine 123 is not required to control the address switch circuit 123f. Over the entire time period of the password unlock operation, the address switch signal n41 remains inactive. Thereby, the load on the state machine 123 can be reduced.

FIG. 11 is a circuit diagram showing the structure of a determination circuit for one bit. In FIG. 11, a signal index i designates a data bit number indicated by address <j>, and a signal index j designates an address bit number based on the output from the address control circuit 124. The determination circuit comprises inverter circuits 360 to 364 and 374, clocked inverter circuits 365 and 366, an exclusive-OR (XOR) circuit 367, NAND circuits 368 to 370 and a NOR circuit 371.

Data, which is input from a data line DIN<i>, is inverted by the inverter circuit 374. The data output from inverter circuit 374 is input to the clocked inverter circuit 365. The clocked inverter circuit 365 outputs data when the signal PAGE<j> is "1" data. The data output from the clocked inverter circuit 365 is input to a data retaining circuit 372. The data retaining circuit 372 comprises the inverter 362 and clocked inverter circuit 366. The clocked inverter circuit 366 outputs data when the signal PAGE<j> is "0" data. In other words, the data retaining circuit 372 retains the input data when the signal PAGE<j> is "0" data.

The data output from the data retaining circuit 372 is input to the XOR circuit 367. Data input from the bus A_DSB<i> is also input to the XOR circuit 367. The XOR circuit 367 compares the input two data. The input data coincide, the XOR circuit 367 outputs "0" data.

The data output from the XOR circuit 367 is input to the NAND circuit 368. In addition, a signal CMPSET<j> is also input to the NAND circuit 368. Data output from the NAND circuit 368 is input to a verify result retaining circuit 373. The verify result retaining circuit 373 comprises two NAND circuits 369 and 370.

Data output from the verify result retaining circuit 373 is input to the NOR circuit 371. A signal COMP<j-1> is also input to the NOR circuit 371 via the inverter circuit 364. The NOR circuit 371 produces a signal COMP<j>.

The verify result retaining circuit 373 is reset before execution of the retaining operation. The reset is effected by a reset signal CMPRST. The reset signal CMPRST is input to the verify result retaining circuit 373 via the inverter circuit 363. The all-address reset signal n31 is input to the OR circuit 111 from the state machine 123, and the OR circuit 111 produces the signal CMPRST.

The data register comprises a predetermined number of units of data retaining circuits 372. Similarly, the verify register comprises a predetermined number of units of verify result retaining circuits 373.

In the auto operation, other than the password unlock operation, the data that is stored in the data retaining circuit 372 is written in the memory cell array 1 via a bus A_PRG (not shown) on the basis of the associated address.

Referring to FIG. 11, a password determination operation is described. When the signal PAGE<0> is activated, the determination circuit 300 stores the password data, which is input from the data bus DIN, in the data register (data retaining circuit 372). The determination circuit 300 compares the password data, which is input from the data bus DIN, with the password data, which is read out of the memory cell array 1 and is input from the bus A_DSB.

Further, when the signal CMPSET<0> is activated, the determination circuit 300 stores the comparison result in the verify register (verify result retaining circuit 373). The determination circuit 300 activates a coincidence signal COMP<0> when the signal CMPSET<0> is activated and the data coincide. In addition to this condition, if the coincidence signal in the low-order determination circuit is activated, the determination circuit, 301 to 307, outputs a determination result.

The determination circuits 300 to 307 are configured such that only the determination circuit that is associated with the address generated by the address counter circuit 404 may execute the determination operation. Thereby, if password data are not input from outside in a successive order, the coincidence signal, COMP<0> to COMP<7>, is not activated.

If collation of the first password data PWD0 is completed, the state machine 123 generates the next-password reception permission signal NEXTEN. If the write enable signal /WE is input, the command decoder 121 activates a signal UNLKCMD that corresponds to a predetermined number of times. The state machine 123 receives the change in state, and transits to the next state. This operation is as illustrate in the flow chart of FIG. 3.

The data control circuit 125 detects the generation of the final password comparison start signal n01, and activates the unlock permission signal UNLKOK only when all password data coincide. In case of noncoincidence, the signal UNLKOK remains inactive. In the case of the verify operation at the time of page write, the data control circuit 125 activates the verify signal VERIOK.

The signal UNLKOK is input to the coincidence detection circuit 123b. The auto address A_ADD is input to the final address detection circuit 123a. The final address detection circuit 123a detects whether the address is the final address of the password data. The detection result is output to the coincidence detection circuit 123b. When the signal UNLKOK is activated and the coincidence detection circuit 123b is informed of the detection of the final address from the final address detection circuit 123a, the coincidence detection circuit 123b informs the operation detection circuit 123c of the coincidence of the password data.

Upon receiving the information on the coincidence of password, the command reception permission circuit 123j activates the unlock signal UNLOCK. The unlock signal UNLOCK is input to the command permission register 126. FIG. 12 is a circuit diagram showing the structure of the command permission register 126.

The command permission register 126 comprises two NOR circuits 500 and 501. The command permission register 126 receives a signal PONRST, a signal RESET and the unlock signal UNLOCK. The signal PONRST is a signal that is activated only when power to the nonvolatile semiconductor memory device is turned on. The signal PONRST may be input from outside or may be generated within the nonvolatile semiconductor memory device. The signal RESET is generated from the signal /RESET that is input to the input signal buffer 13.

The command permission register 126 is put in the set state by the signal PONRST or signal RESET. In the set state, the command permission register 126 keeps a signal ROMEN inactive. The signal ROMEN is input to the command decoder 121. When the signal ROMEN is inactive, the command decoder 121 does not receive a command that relates to rewrite of the protect ROM 31. Thus, the command permission register 126 is always in the set state as long as the signal UNLOCK is not activated by the password unlock operation after the power-on of the device. In short, the device is in the locked state.

If the unlock command is input to the device and the unlock operation is successfully executed, the activated signal UNLOCK is input to the command permission register 126. Thereby, the state of the command permission register 126 is changed to the reset state. In the reset state, the command permission register 126 keeps the signal ROMEN active. When the signal ROMEN is active, the command decoder 121 is enabled to receive a command relating to rewrite of the protect ROM 31. Thus, the protect state, which is stored in the protect ROM 31, can be rewritten by the external circuit.

Regardless of coincidence/noncoincidence of all password data, if the pulse of the final password comparison start signal n01 is generated and then the signal n01 is rendered inactive, the state machine 123 generates an operation end signal that finishes the password unlock operation. The operation end signal is delivered to the command decoder 121, although not shown. If the operation end signal is activated, the command decoder 121 deactivates the signal UNLKCMD[0] and signal UNLKCMD[4]. After the operation end signal is activated and then deactivated, the present memory device is returned to the initial state.

As has been described above in detail, according to the present embodiment, the circuit for use in the page write operation is shared in the password unlock operation. In addition, this embodiment includes the select circuits 300 to 307 that store the fact of successful collation of four password data in the predetermined order and the determination result of coincidence/noncoincidence. Moreover, a password collation result is output on the basis of the address that represents the predetermined order, which is generated from the address counter circuit 404, aside from the address input from outside.

Therefore, according to the present embodiment, an increase in circuit area, which is caused by the provision of the password unlock function, can be minimized.

It is possible to prevent unlock even if an invalid address and data are input from outside in the password unlock operation. Therefore, the data protection level can be enhanced.

The present embodiment assumes that the number of password data words is less than the number of page write words. In a case where both numbers of words are equal, the signal UNLKOK may be replaced with the signal VERIOK.

Second Embodiment

In a second embodiment of the present invention, the circuit for the password unlock operation, which has been described in connection with the first embodiment, is used for the page write operation, thereby realizing a high-speed page write operation. The circuit diagram of the second embodiment is the same as that of FIG. 1.

The command decoder 121 interprets a page write command that is input from outside and activates a data reception permission signal PGINCMD that permits reception of a predetermined number of data that are input immediately thereafter. A logical sum between this signal PGINCMD and a signal UNLKINCMD, which is inactive in the page write operation, is produced as a signal PGDLATCHB, and the signal PGDLATCHB is input to the data control circuit 125. If a predetermined number of data are stored in the data control circuit 125, the command decoder 121 activates a signal PGPRGCMD that instructs a page write auto operation. This signal is delivered to the state machine 223. Then, the page write operation is performed according to conventional operational procedures.

FIG. 13 is a block diagram showing the structure of the state machine 223. The state machine 223 includes a final address detection circuit 223a, a coincidence detection circuit 223b, an operation detection circuit 223c, and a timer circuit 223j.

The operation detection circuit 223c detects the state of progress of the page write operation. Based on the detected state of progress, the operation detection circuit 223c generates control signals necessary for the next operation. The operation detection circuit 223c includes an all-address reset circuit 223d, a page address reset circuit 223e, an address count-up circuit 223f, an address switch circuit 223g, an address selection permission circuit 223h, and a comparison permission circuit 223i.

Prior to the start of the page write operation, signals that are output from the state machine 223 are in the inactive state. The state machine 223 starts to operate, upon detecting that the signal PGPRGCMD output from the command decoder 121 is activated. The state machine 223 is in the operative state while the signal PGPRGCMD is in the activated state.

The final address detection circuit 223a detects whether the auto address A_ADD input from the address control circuit 124 is the final address of addresses of one page.

If the timer circuit 223j has counted a predetermined time period, the timer circuit 223j delivers to the operation detection circuit 223c a signal that is indicative of the passage of the predetermined time period. The timer circuit 223j may be configured to be shared with the state machine 123.

If the signal PGPRGCMD is activated, the all-address reset circuit 223d activates an all-address reset signal n32. The signal n32 is input as an all-address reset signal A_ADDRST via the OR circuit 109 to the address counter circuit 404 included in the address control circuit 124. The address counter circuit 404 resets the count value if the all-address reset signal A_ADDRST is activated.

The page address reset circuit 223e generates a two-bit reset signal A_PGRST<1:0>. A 0-th bit of the reset signal A_PGRST<1:0> is input via the OR circuit 406 to the reset terminals RST of the address 0 counter 404a and address 1 counter 404b. A first bit of the reset signal A_PGRST<1:0> is input via the OR circuit 405 to the reset terminal RST of the address 2 counter 404c.

If the signal A_PGRST<0> is activated, the address counter circuit 404 resets the address counters for the low-order four addresses of the eight addresses. Specifically, in the case of a 20-bit address, the 0-th bit (lowest-order bit) and first bit are reset. If the signal A_PGRST <1> is activated, the address counter circuit 404 resets the address counters for the high-order four addresses of the eight addresses. Specifically, in the case of a 20-bit address, the third bit is reset.

If the signal PGPRGCMD is activated, the address switch circuit 223g activates an address switch signal n42 for effecting switching to the address that is generated by the address control circuit 124. The signal n42 is input as an address switch signal CUTIN to the address control circuit 124 via the OR circuit 108.

If the signal PGPRGCMD is activated, the address selection permission circuit 223h activates a signal n22 that activates the address signal line for auto operations. The signal n22 is input, as an address line activating signal ADECEN, via the OR circuit 107 to the auto bank select circuit 101.

After verify data for the auto operation is sent to the bus A_DSB, the comparison permission circuit 223i activates a verify comparison permission signal n02 (comprising one pulse). The signal n02 is input as signal CMPSET to the data control circuit 125 via the OR circuit 106. Thereby, a verify operation is performed to execute verification between the write data, which is input from outside of the device, and the data that is stored in the memory cell array 1 and read out immediately thereafter.

Assume that after completion of the verify operation, the final address detection circuit 223a issues a notice that the input address is not the final address in the verify operation. In this case, the address count-up circuit 223f activates a 1-pulse count-up signal n52 in order to execute a verify operation for the next address. The pulse signal n52 is input, as a count-up signal A_ADDADV, via the OR circuit 110 to the address counter circuit 404. Thereby, the address counter circuit 404 increments the count value by, e.g. a binary data value "1."

Although not shown, the operation timing of the state machine 223 is determined in sync with the rising or falling of a reference clock signal that is generated internally or externally. Alternatively, the state machine 223 may be a circuit that generates the next signal with a given time period after detection of the signal output from the command decoder 121 or the signal generated by the state machine 223.

Next, the operation of the nonvolatile semiconductor memory device with the above-described structure is described. Data write in the memory cell array 1 is executed by conventional means. For example, a boost potential is applied to the word lines of the memory cell array 1, and a predetermined write voltage corresponding to write data is applied to the bit lines. A current for write is supplied for a predetermined time period, and hot electrons, which are generated in the channel region of the memory cell, are injected in a region called "floating gate" of the memory cell. Thereby, the threshold voltage of the memory cell is varied. This series of control operations, although not illustrated in drawings, are executed by a timing generating circuit that is disposed in the state machine 223. At a predetermined timing, information is issued to the internal power supply control circuit 41, thereby controlling the word lines and bit lines.

After completion of the write operation, a verify operation is executed to confirm that predetermined data is written in the memory cell array 1. The verify operation is performed in the same manner as the password determination operation that is described in connection with the first embodiment. In the case where the number of addresses for page write is 8 and the number of addresses for the password is 4, the verify results are stored in the verify registers that are included in the determination circuits 300 to 307 in association with the comparison permission signals CMPSET<0> to CMPSET<7>. Of the verify results, the collation results of all addresses are told to the state machine 223 by the conventional signal VERIOK and the verify results of addresses 0 to 3 are told to the state machine 223 by the signal UNLKOK.

A verify read operation is executed by a conventional method. For example, a read-out voltage is applied to the word lines of the memory cells, and a predetermined read-out voltage is applied to the bit lines of the memory cells. A potential corresponding to the data written in the memory cell is sent to the verify sense amplifier 4 via the column gate 3. The verify sense amplifier 4 senses a small potential difference between a predetermined reference potential and a potential corresponding to the data written in the memory cell. If the reference potential is higher, "1" data is determined. If the reference potential is lower, "0" data is determined. The verify sense amplifier 4 outputs the sensed data to the bus A_DSB. Although not shown, the sense operation is controlled by a control signal that is activated by the state machine 223. At a predetermined timing, information is issued to the internal power supply control circuit 41, thereby controlling the word lines and bit lines.

The activated state of the signal VERIOK in the verify operation indicates that the verify results of all-address data in one page coincide. Thus, the state machine 223 determines that the page write operation is normally completed, and activates the operation end signal, thereby informing the command decoder 121 of the end of the operation, though not shown. In response, the command decoder 121 deactivates the signal PGPRGCMD. If the signal PGPRGCMD is deactivated, the all-address reset circuit 223d activates the signal n32, the address switch circuit 223g deactivates the signal n42 and the address selection permission circuit 223h deactivates the signal n22. Then, the state machine 223 sets the operation end signal in the inactive state. Thereby, the device completes the auto operation and returns to the initial state.

The state in which the signal VERIOK is deactivated and the signal UNLKOK is activated in the verify operation indicates that verify results coincide with respect to the low-order four addresses of the 8 addresses and verify results do not coincide with respect to the high-order four addresses of the 8 addresses. Since data write needs to be executed for the high-order four addresses once again, the page address reset circuit 223e deactivates the signal A_PGRST<1> and activates the signal A_PGRST<0>, thereby to set the initial value of the address counter circuit 404 at "4". In addition, in order to execute the data re-write, the state machine 223 controls the internal power supply control circuit 41 and supplies a high voltage for the write operation to the memory cell array 1.

The state in which both the signal VERIOK and signal UNLKOK are deactivated by the verify operation indicates that verify results do not coincide with respect to both the high-order four addresses and low-order four addresses of the 8 addresses. In this case, the page address reset circuit 223e activates both the signal A_PGRST<1> and signal A_PGRST<0>, thereby to set the initial value of the address counter circuit 404 at "0." Hence, the write operation is executed once again from address "0." In addition, in order to execute the data re-write, the state machine 223 controls the internal power supply control circuit 41 and supplies a high voltage for the write operation to the memory cell array 1.

Figure 14:
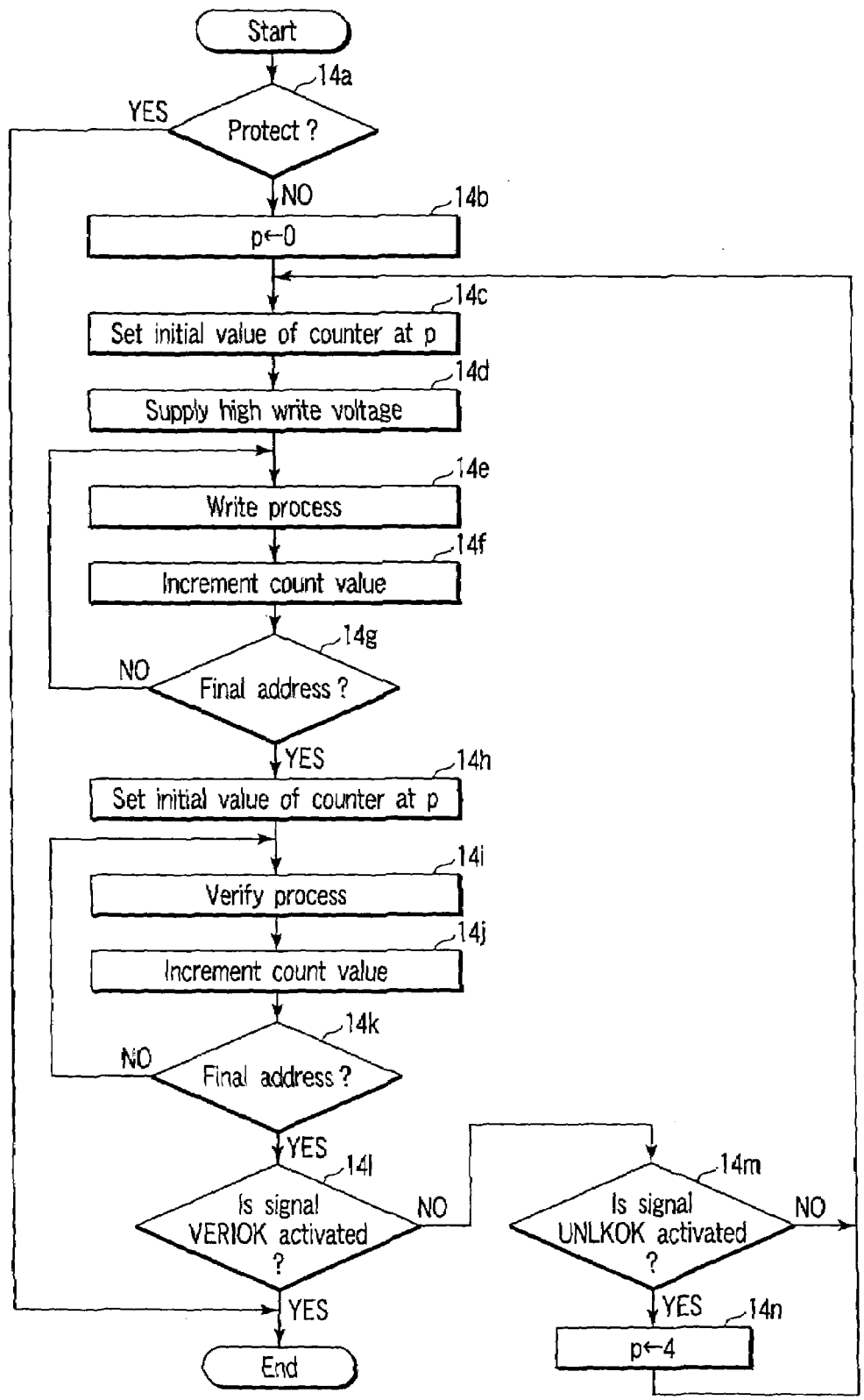
FIG. 14 is a flow chart illustrating a page write operation of the state machine 223 shown in FIG. 13.

FIG. 14 is a flow chart illustrating the page write operation of the state machine 223. The state machine 223 refers to the protect ROM 31 and determines whether the area, in which page write is to be effected, is in the protect state (step 14a). If the area is in the protect state, the state machine 223 finishes the page write operation. If the area is not in the protect state, the state machine 223 sets a value p, which is stored in the register (not shown) in the state machine 223, at "0" (step 14b). Next, the state machine 223 sets the initial value of the address counter circuit 404 at the value p (step 14c).

Subsequently, the state machine 223 controls the internal power supply control circuit 41 and supplies a high voltage for the write operation to the memory cell array 1 (step 14d). Then, the state machine 223 executes a process to write data in the memory cell array 1 (step 14e). Next, the state machine 223 increments the count value of the address counter circuit 404 by 1 (step 14f). The state machine 223 monitors whether the data written in the memory cell array 1 is the final address in one page (step 14g). If the written data is not the final address, the state machine 223 writes data in succession on the basis of addresses.

If the written data is the final address, the state machine 223 executes a verify operation subsequently. To begin with, the state machine 223 sets the initial value of the address counter circuit 404 at the value p (step 14h). The state machine 223 executes verification of the data written in the memory cell array 1 (step 14i). The state machine 223 increments the count value of the address counter circuit 404 by 1 (step 14j). The state machine 223 monitors whether the address of the verified data is the final address (step 14k). If the address of the verified data is not the final address, the state machine 223 executes verification of data in succession on the basis of addresses.

If the address of the verified data is the final address, the state machine 223 monitors whether the signal VERIOK is activated or not (step 14l). If the signal VERIOK is activated, the state machine 223 determines that the write data is exactly written and completes the process. If the VERIOK is not activated, the state machine 223 monitors whether the signal UNLKOK is activated or not (step 14m). If the signal UNLKOK is not activated, the state machine 223 sets the initial value of the address counter 404 at "0", and executes data re-write.

On the other hand, if the signal UNLKOK is activated, the state machine 223 determines that write data of the low-order four addresses is exactly written in the memory cell array 1. The state machine 223 then sets the value p at "4" (step 14n). The state machine 223 sets the initial value of the address counter circuit 404 at "4", and executes re-write of only data of high-order four addresses.

As has been described above in detail, according to the present embodiment, the page write operation is executed using the architecture of the password unlock operation of the first embodiment. Specifically, when it is determined that the page write is not exactly executed (i.e. signal VERIOK is inactive), it is detected whether the data of the low-order four addresses is exactly written. If the data of the low-order four addresses is exactly written (i.e. signal UNLKOK is active), re-write of data of only the high-order four addresses is executed thereafter.

According to the present embodiment, the average write time for page write can be decreased only by imposing on the nonvolatile semiconductor memory device a minimum increase in circuit area due to the provision of the password unlock function. For example, if a verify result shows that the number of bits that require re-write is a random 1 bit, the time for verifying 4-address data can be reduced by about 5 µs.

The present embodiment is applicable not only to the page write operation but also to a pre-erasure write operation that is automatically executed within the device after an erase command is input. The speed of an erase operation, as well as the speed of the pre-erasure write operation, can be increased.

Third Embodiment

A third embodiment of the present invention relates to another example of the structure of the second embodiment. FIG. 15 is a block diagram showing the structure of a data control circuit 125 according to the third embodiment of the invention.

A signal VERIOK is a signal that is activated when verify results of addresses in one page, other than verify results of addresses ("high-order addresses") necessary for the password unlock operation, coincide. On the other hand, a signal UNLKOK is a signal that is activated when verify results of addresses ("low-order addresses") necessary for the password unlock operation coincide. For example, the signal UNLKOK is configured to indicate the verify results of address 0 to address 3, and the signal VERIOK is configured to indicate the verify results of address 4 to address 7.

To realize this configuration, the data control circuit 125 additionally includes an OR circuit 314 having input terminals that receive the coincidence signal COMP<3> and the signal PGPRGCMD. An output signal of the OR circuit 314, instead of the signal COMP<3>, is input to the determination circuit 304. Thereby, even when the coincidence signal COMP<3> is not activated, the determination circuit 304 can output the coincidence signal COMP<4> during the page write operation (i.e. when signal PGPRGCMD is activated).

Figure 16:
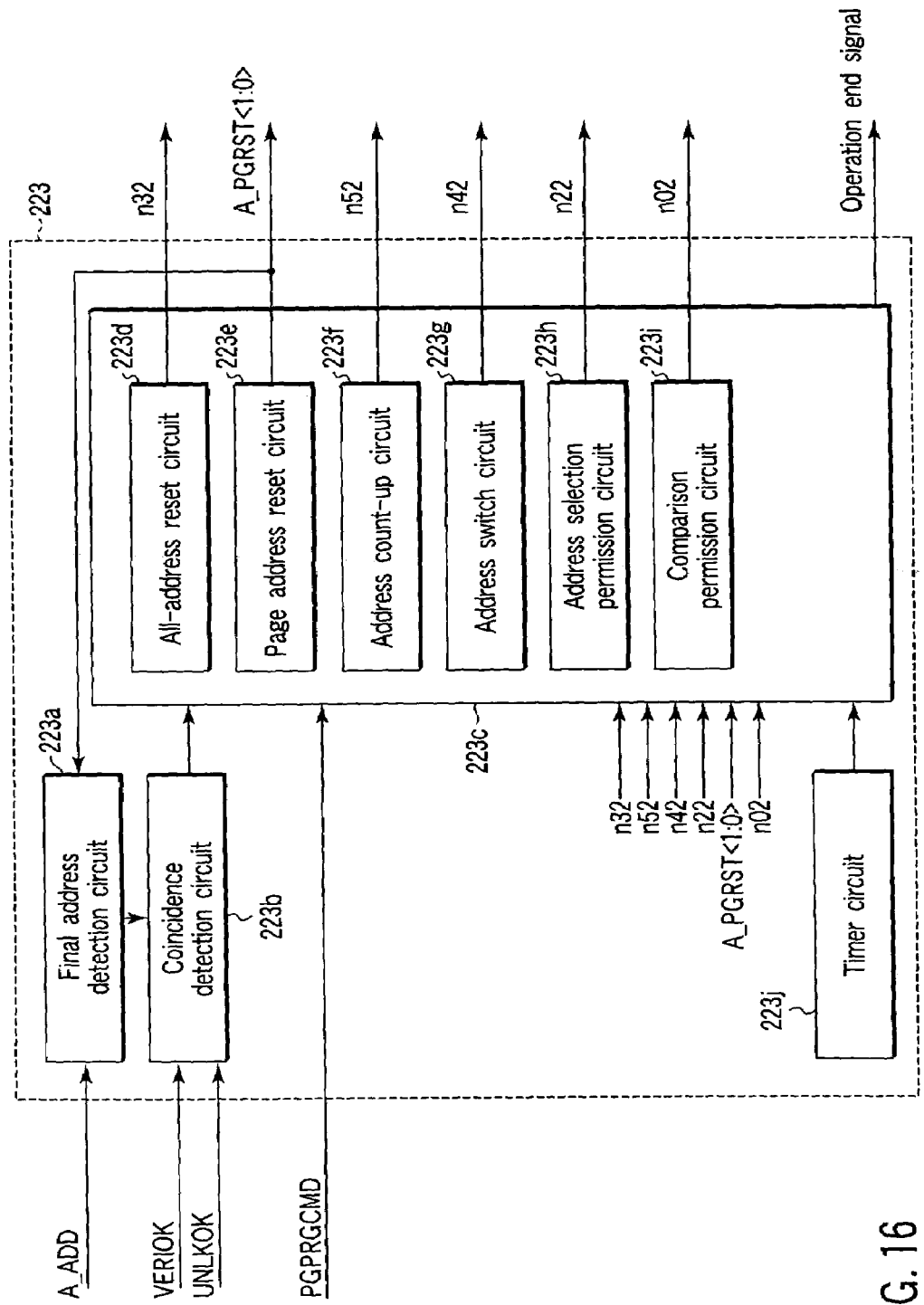
FIG. 16 is a block diagram showing the structure of a state machine 223 according to the third embodiment of the present invention.

FIG. 16 is a block diagram showing the structure of a state machine 223 according to the third embodiment of the invention. In FIG. 16, the signal A_PGRST<0> that is output from the page address reset circuit 223e is input to the final address detection circuit 223a.

Next, the operation of the nonvolatile semiconductor memory device with the above-described structure is described. The state in which the signal VERIOK is deactivated and the signal UNLKOK is activated in the verify operation indicates that verify results coincide with respect to the low-order four addresses of the 8 addresses and verify results do not coincide with respect to the high-order four addresses of the 8 addresses. Since data write needs to be executed once again for the high-order four addresses, the page address reset circuit 223e deactivates the signal A_PGRST<1> and activates the signal A_PGRST<0>, thereby to set the initial value of the address counter circuit 404 at "4". In addition, the signal A_PGRST<1:0> is also input to the final address detection circuit 223a. When the signal A_PGRST<1> is deactivated and the signal A_PGRST<0> is activated, the final address detection circuit 223a sets the final address value e at "7".

The state in which the signal VERIOK is activated and the signal UNLKOK is deactivated in the verify operation indicates that verify results coincide with respect to the high-order four addresses of the 8 addresses and verify results do not coincide with respect to the low-order four addresses of the 8 addresses. Since data write needs to be executed once again for the low-order four addresses, the page address reset circuit 223e activates the signal A_PGRST<1> and deactivates the signal A_PGRST<0>, thereby to set the initial value of the address counter circuit 404 at "0". In addition, when the signal A_PGRST<1> is activated and the signal A_PGRST<0> is deactivated, the final address detection circuit 223a sets the final address value e at "3".

The state in which both the signal VERIOK and signal UNLKOK are deactivated by the verify operation indicates that verify results do not coincide with respect to both the high-order four addresses and low-order four addresses of the 8 addresses. In this case, the page address reset circuit 223e activates both the signal A_PGRST<1> and signal A_PGRST<0>, thereby to set the initial value of the address counter circuit 404 at "0." Hence, the write operation is executed once again from address "0." In addition, when the signal A_PGRST<1> and signal A_PGRST<0> are activated, the final address detection circuit 223a sets the final address value e at "7".

Figure 17:
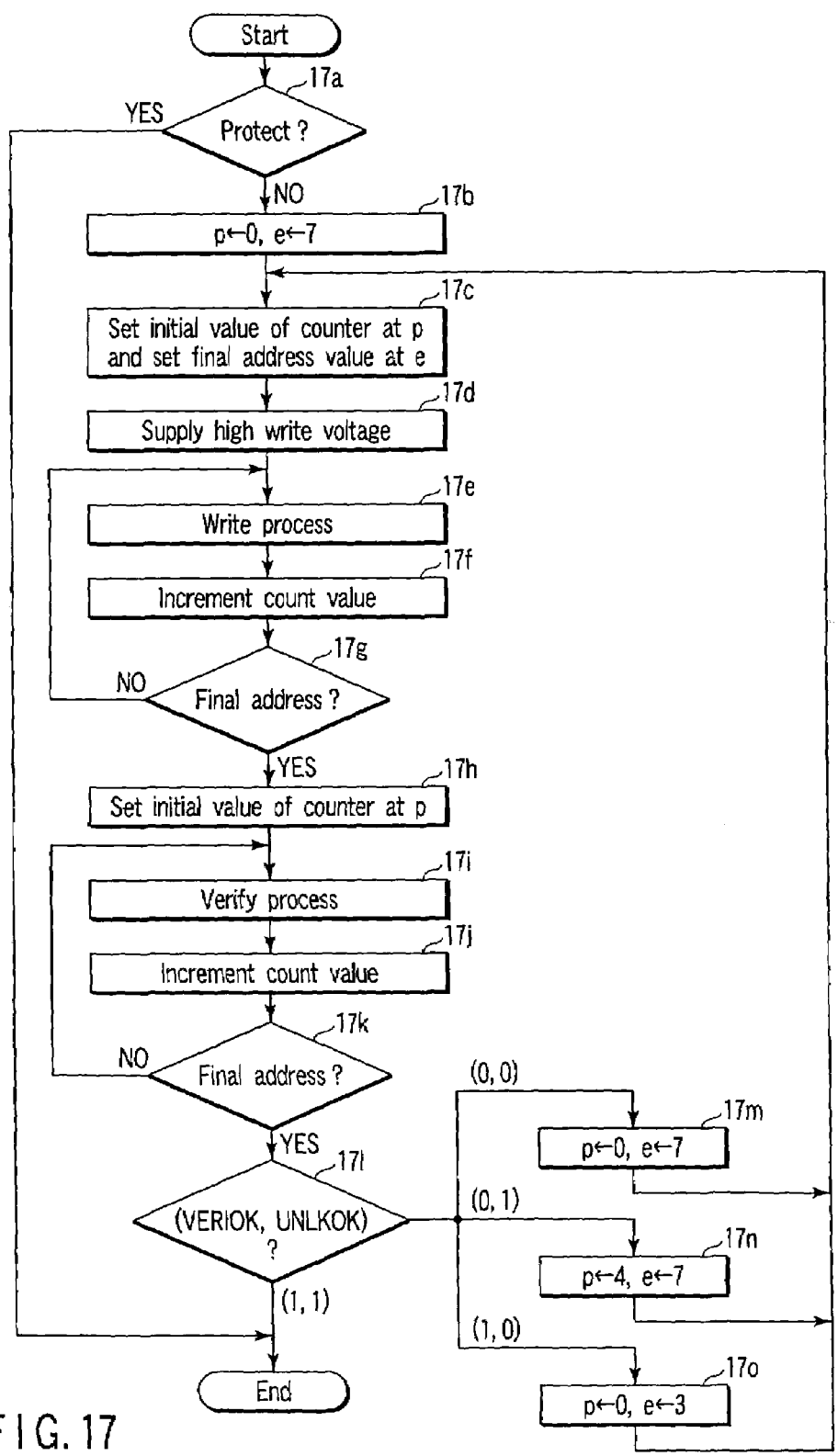
FIG. 17 is a flow chart illustrating a page write operation of the state machine 223 shown in FIG. 16.

FIG. 17 is a flow chart illustrating the page write operation of the state machine 223. The state machine 223 refers to the protect ROM 31 and determines whether the area, in which page write is to be effected, is in the protect state (step 17a). If the area is in the protect state, the state machine 223 finishes the page write operation. If the area is not in the protect state, the state machine 223 sets a value p, which is stored in the register (not shown) in the state machine 223, at "0", and sets the value e at 1"7" (step 17b). Next, the state machine 223 sets the initial value of the address counter circuit 404 at the value p, and sets the final address value of the final address detection circuit 223a at the value e (step 17c).

Subsequently, the state machine 223 controls the internal power supply control circuit 41 and supplies a high voltage for the write operation to the memory cell array 1 (step 17d). Then, the state machine 223 executes a process to write data in the memory cell array 1 (step 17e). Next, the state machine 223 increments the count value of the address counter circuit 404 by 1 (step 17f). The state machine 223 monitors whether the data written in the memory cell array 1 is the final address in one page (step 17g). If the written data is not the final address, the state machine 223 writes data in succession on the basis of addresses.

If the written data is the final address, the state machine 223 executes a verify operation subsequently. To begin with, the state machine 223 sets the initial value of the address counter circuit 404 at the value p (step 17h). The state machine 223 executes verification of the data written in the memory cell array 1 (step 17i). The state machine 223 increments the count value of the address counter circuit 404 by 1 (step 17j). The state machine 223 monitors whether the address of the verified data is the final address (step 17k). If the address of the verified data is not the final address, the state machine 223 executes verification of data in succession on the basis of addresses.

If the address of the verified data is the final address, the state machine 223 monitors whether the signal VERIOK is activated and the signal UNLKOK is activated (step 17l). If both the signal VERIOK and the signal UNLKOK are activated ((1, 1) in FIG. 17), the state machine 223 determines that the write data is exactly written, and completes the process.

If the signal VERIOK and signal UNLKOK are deactivated ((0, 0) in FIG. 17), the state machine 223 sets the value p at "0" and sets the value e at "7" (step 17m). Thereby, the state machine 223 executes the page write, using "0" as the initial value of the address counter circuit 404 and "7" as the final address value of the final address detection circuit 223a.

If the signal VERIOK is deactivated and signal UNLKOK is activated ((0, 1) in FIG. 17), the state machine 223 sets the value p at "4" and sets the value e at "7" (step 17n). Thereby, the state machine 223 executes the page write, with the initial value "4" of the address counter circuit 404 and the final address value "7" of the final address detection circuit 223a.

If the signal VERIOK is activated and signal UNLKOK is deactivated ((1, 0) in FIG. 17), the state machine 223 sets the value p at "0" and sets the value e at "3" (step 17o). Thereby, the state machine 223 executes the page write, with the initial value "0" of the address counter circuit 404 and the final address value "3" of the final address detection circuit 223a.

As has been described above in detail, in this embodiment, the page write operation is executed by using the architecture of the password unlock operation in the first embodiment. Specifically, if it is determined that the page write is not exactly executed (i.e. signal VERIOK is deactivated), it is checked which of the data of the high-order four addresses and the data of the low-order four addresses has not exactly been written. Only the data of the addresses, which has not exactly been written, is written once again.

Therefore, according to the present embodiment, the average write time for page write can be decreased only by imposing on the nonvolatile semiconductor memory device a minimum increase in circuit area due to the provision of the password unlock function. Compared to the second embodiment, the average write time for page write can further be reduced.

The present embodiment is applicable not only to the page write operation but also to a pre-erasure write operation that is automatically executed within the device after an erase command is input. The speed of an erase operation, as well as the speed of the pre-erasure write operation, can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device with a function of executing a verify operation for write data, comprising:

a memory cell array including memory cells arranged in a matrix, and a password storage area for storing password data;

an input buffer that receives data input from outside;

a first retaining circuit that retains input password data or write data, which is input to the input buffer;

a verify sense amplifier that detects, at a time of the verify operation, the password data that is read out of the password storage area or data that is read out of the memory cell array; and a coincidence determination circuit that determines whether the input password data coincides with the read-out password data, or determines whether the write data coincides with the read-out data.

2. The nonvolatile semiconductor memory device according to claim 1, wherein the input password data comprises a plurality of input password data, and the coincidence determination circuit includes a plurality of coincidence determination circuits that correspond to said plurality of input password data.

3. The nonvolatile semiconductor memory device according to claim 2, wherein said plurality of input password data are successively input to the input buffer, and said plurality of coincidence determination circuits successively determine whether the input password data coincide with the read-out password data that correspond to the input password data.

4. The nonvolatile semiconductor memory device according to claim 3, wherein each of the coincidence determination circuits executes determination when immediately prior input password data coincides.

5. The nonvolatile semiconductor memory device according to claim 2, wherein each of the coincidence determination circuits includes a second retaining circuit that retains a determination result.

6. The nonvolatile semiconductor memory device according to claim 5, further comprising a first output circuit that outputs a first coincidence signal when all of the second retaining circuits, which correspond to said plurality of input password data, show determination results of coincidence.

7. The nonvolatile semiconductor memory device according to claim 1, further comprising a command control circuit that causes the coincidence determination circuit to determine whether the input password data coincides with the read-out password data, on the basis of a first command that is input from outside.

8. The nonvolatile semiconductor memory device according to claim 3, further comprising a command control circuit that causes said plurality of coincidence determination circuits to successively determine whether said plurality of input password data coincide with said plurality of read-out password data, on the basis of a first command that is input from outside.

9. The nonvolatile semiconductor memory device according to claim 8, wherein the command control circuit causes the coincidence determination circuits to successively execute determination on the basis of a write enable signal that is input from outside along with the input password data.

10. The nonvolatile semiconductor memory device according to claim 2, further comprising an address buffer that receives a plurality of first addresses input from outside, wherein each of the coincidence determination circuits determines whether the input password data corresponding to the first address coincides.

11. The nonvolatile semiconductor memory device according to claim 10, further comprising:

a first address generation circuit that generates a plurality of second addresses of said plurality of read-out password data; and an address select circuit that selects said plurality of first addresses and said plurality of second addresses, wherein each of the coincidence determination circuits determines whether the input password data corresponding to the first address coincides with the read-out password data corresponding to the second address.

12. The nonvolatile semiconductor memory device according to claim 11, wherein the first retaining circuit includes a plurality of first retaining circuits that correspond to said plurality of input password data.

13. The nonvolatile semiconductor memory device according to claim 12, further comprising:

a permission circuit that permits one of said plurality of first retaining circuits to retain the input password data, on the basis of the first address; and a determination select circuit that selects one of said plurality of determination circuits, on the basis of the second address, wherein each of the coincidence determination circuits, when permitted by permission circuit and selected by the determination select circuit, executes determination.

14. The nonvolatile semiconductor memory device according to claim 6, wherein the write data comprises a plurality of write data and includes a first data portion corresponding to said plurality of input password data and a second data portion that is greater than the first data portion, the coincidence determination circuit includes a plurality of coincidence determination circuits corresponding to said plurality of write data, and the device further comprises:

a second output circuit that outputs a second coincidence signal when all of the second retaining circuits corresponding to said plurality of write data show coincidence determination results; and a write control circuit that executes re-write of only the second data portion when the second coincidence signal is not output and the first coincidence signal is output.

15. The nonvolatile semiconductor memory device according to claim 6, wherein the write data comprises a plurality of write data and includes a first data portion corresponding to said plurality of input password data and a second data portion that is greater than the first data portion, the coincidence determination circuit includes a plurality of coincidence determination circuits corresponding to said plurality of write data, and the device further comprises:

a third output circuit that outputs a third coincidence signal when all of the second retaining circuits corresponding to the second data portion show coincidence determination results; and a write control circuit that executes re-write of only the first data portion when the first coincidence signal is not output and the third coincidence signal is output, and executes re-write of only the second data portion when the first coincidence signal is output and the third coincidence signal is not output.

16. The nonvolatile semiconductor memory device according to claim 14, further comprising a second address generation circuit that generates an address corresponding to the second data portion, when the second coincidence signal is not output and the first coincidence signal is output.

17. The nonvolatile semiconductor memory device according to claim 15, further comprising a second address generation circuit generates an address corresponding to the first data portion when the first coincidence signal is not output and the third coincidence signal is output, and generates an address corresponding to the second data portion when the first coincidence signal is output and the third coincidence signal is not output.

18. The nonvolatile semiconductor memory device according to claim 1, further comprising:

a protect information memory circuit that stores information indicative of an area that is included in the memory cell array and is protected; and a setting circuit that sets the device in a state in which rewrite is executable in the protect information memory circuit, when the input password data coincides with the read-out password data.

* * * * *